(12) United States Patent
Eriksson et al.

(10) Patent No.: US 12,382,597 B2
(45) Date of Patent: Aug. 5, 2025

(54) HINGE BETWEEN A FIRST PART AND A SECOND PART IN AN ELECTRICAL DEVICE

(71) Applicant: Skugga Technology AB, Stockholm (SE)

(72) Inventors: Mikael Eriksson, Hagersten (SE); Daniel Eriksson, Stockholm (SE); Jonas Eriksson, Huddinge (SE); Fredrik Hanson, Stockholm (SE)

(73) Assignee: SKUGGA TECHNOLOGY AB, Stockholm (SE)

( * ) Notice: Subject to any disclaimer, the term of this patent is extended or adjusted under 35 U.S.C. 154(b) by 0 days.

(21) Appl. No.: 18/551,612

(22) PCT Filed: Mar. 31, 2022

(86) PCT No.: PCT/SE2022/050321
§ 371 (c)(1),
(2) Date: Sep. 21, 2023

(87) PCT Pub. No.: WO2022/211718
PCT Pub. Date: Oct. 6, 2022

(65) Prior Publication Data
US 2024/0098918 A1 Mar. 21, 2024

(30) Foreign Application Priority Data
Apr. 1, 2021 (SE) .................... 2150419-6

(51) Int. Cl.
*H05K 5/02* (2006.01)
(52) U.S. Cl.
CPC .................... *H05K 5/0226* (2013.01)
(58) Field of Classification Search
CPC ...... H05K 5/0226; G06F 1/1681; G02C 5/22; H01R 35/02; H01R 13/5829
See application file for complete search history.

(56) References Cited

U.S. PATENT DOCUMENTS

| 5,258,784 A | 11/1993 | Baines |
| 6,163,926 A * | 12/2000 | Watanabe ................ G02C 5/22 351/153 |

(Continued)

FOREIGN PATENT DOCUMENTS

| SE | 1930272 A1 | 2/2021 |
| WO | 2018084772 A1 | 5/2018 |

OTHER PUBLICATIONS

International Search Report & Written Opinion dated May 12, 2022, Swedish Patent Office, Stockholm, Sweden.

*Primary Examiner* — Allen L Parker
*Assistant Examiner* — Douglas R Burtner
(74) *Attorney, Agent, or Firm* — Noréns PatentbyráAB

(57) ABSTRACT

Hinge between two parts of an electrical device, wherein at least one cable/wire/pcb is running therebetween, having at least two axes connections, a first connection (5a) at the first part and a second connection (5b) at the second part, therebetween at least one central part (7), which is connected to the first axis connection and the second axis connection, or to a next central part (7"), which next central part in turn is connected to the second axis connection, or a next central part (7") and so on until the second axis connection is reached, the each central part is provided with throughgoing hole (11) going between the first end to its second end for the cable/wire/pcb (14) to run freely in, forming a throughgoing hole (111) in the hinge, one connection is on one side of the throughgoing hole and one on a second side. Spectacle, laptop comprising hinge.

8 Claims, 26 Drawing Sheets

(56) References Cited

U.S. PATENT DOCUMENTS

| | | | |
|---|---|---|---|
| 7,512,426 B2* | 3/2009 | Maatta | G06F 1/1681 |
| | | | 455/575.1 |
| 8,266,882 B2* | 9/2012 | Hermey | H02G 3/0475 |
| | | | 248/51 |
| 9,151,782 B2* | 10/2015 | Lint | G01R 15/181 |
| 9,370,342 B2* | 6/2016 | Zubiate | A61B 1/00052 |
| 9,599,295 B2* | 3/2017 | Delano | F21V 23/023 |
| 9,939,852 B1 | 4/2018 | Rauner et al. | |
| 10,501,973 B2* | 12/2019 | Määttä | E05D 3/12 |
| 10,752,181 B2* | 8/2020 | Livingston Viswasam | |
| | | | B60R 11/0235 |
| 10,753,554 B2* | 8/2020 | Jiang | F21V 21/22 |
| 10,768,667 B2* | 9/2020 | Lin | H04M 1/0268 |
| 11,061,251 B2* | 7/2021 | Eriksson | G02C 5/2209 |
| 11,340,476 B1* | 5/2022 | Bobuk | G02B 6/0005 |
| 11,504,144 B2* | 11/2022 | Kim | A61B 17/2909 |
| 2004/0266239 A1 | 12/2004 | Kurokawa | |
| 2008/0013041 A1* | 1/2008 | Chou | G02C 11/06 |
| | | | 351/158 |
| 2008/0210828 A1* | 9/2008 | Kogure | B60R 16/0215 |
| | | | 248/65 |
| 2012/0120618 A1* | 5/2012 | Bohn | H04M 1/022 |
| | | | 361/679.01 |
| 2012/0257368 A1* | 10/2012 | Bohn | H04M 1/022 |
| | | | 16/319 |
| 2018/0044958 A1* | 2/2018 | Tazbaz | G06F 1/1615 |
| 2018/0195329 A1* | 7/2018 | Alletto | E05D 3/12 |
| 2018/0252940 A1* | 9/2018 | Rabut | G02C 5/22 |
| 2019/0166703 A1* | 5/2019 | Kim | H05K 5/0226 |
| 2019/0265510 A1* | 8/2019 | Eriksson | G02C 5/22 |
| 2021/0275266 A1* | 9/2021 | Kim | A61B 1/0016 |
| 2023/0033269 A1* | 2/2023 | Dal Pont | G02C 5/146 |

* cited by examiner

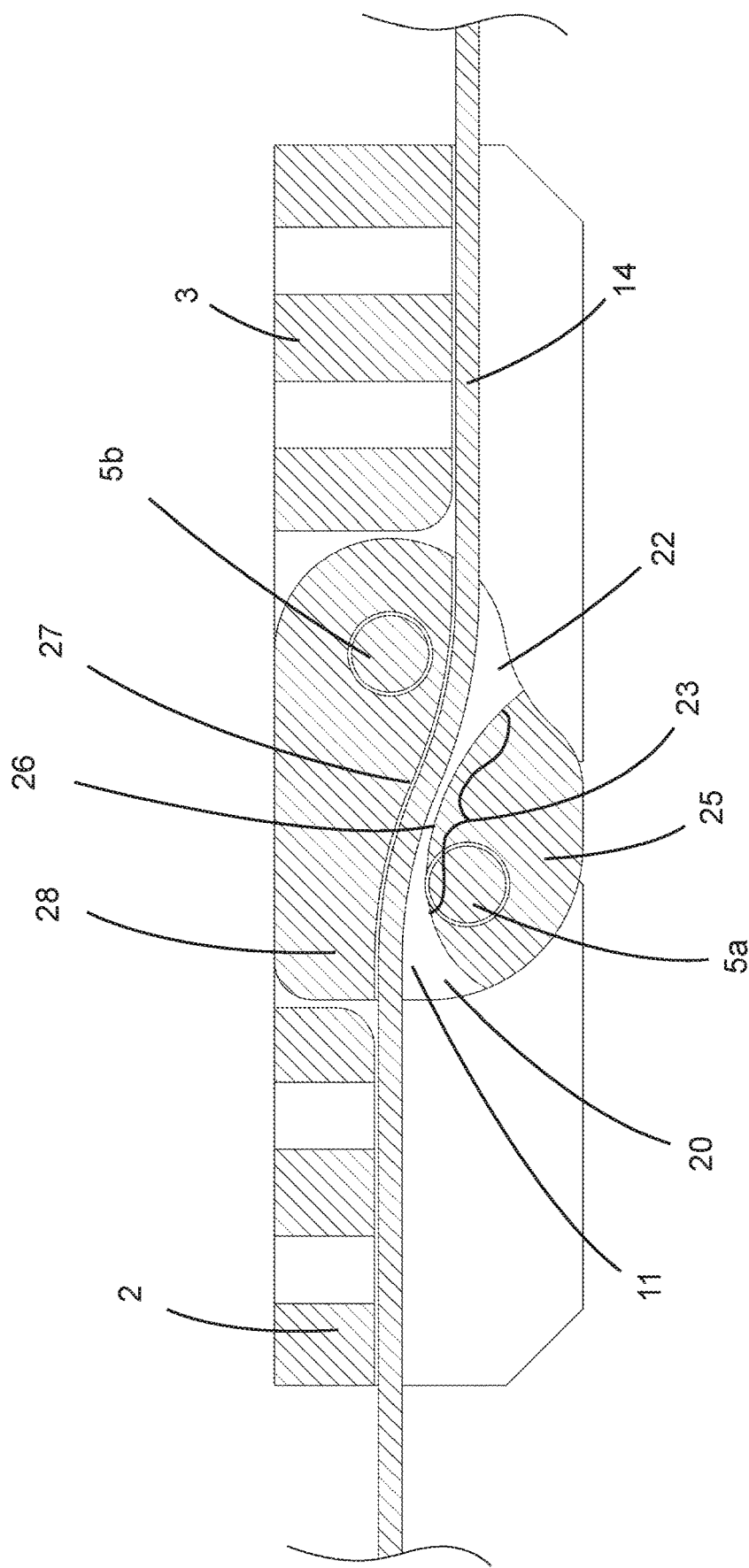

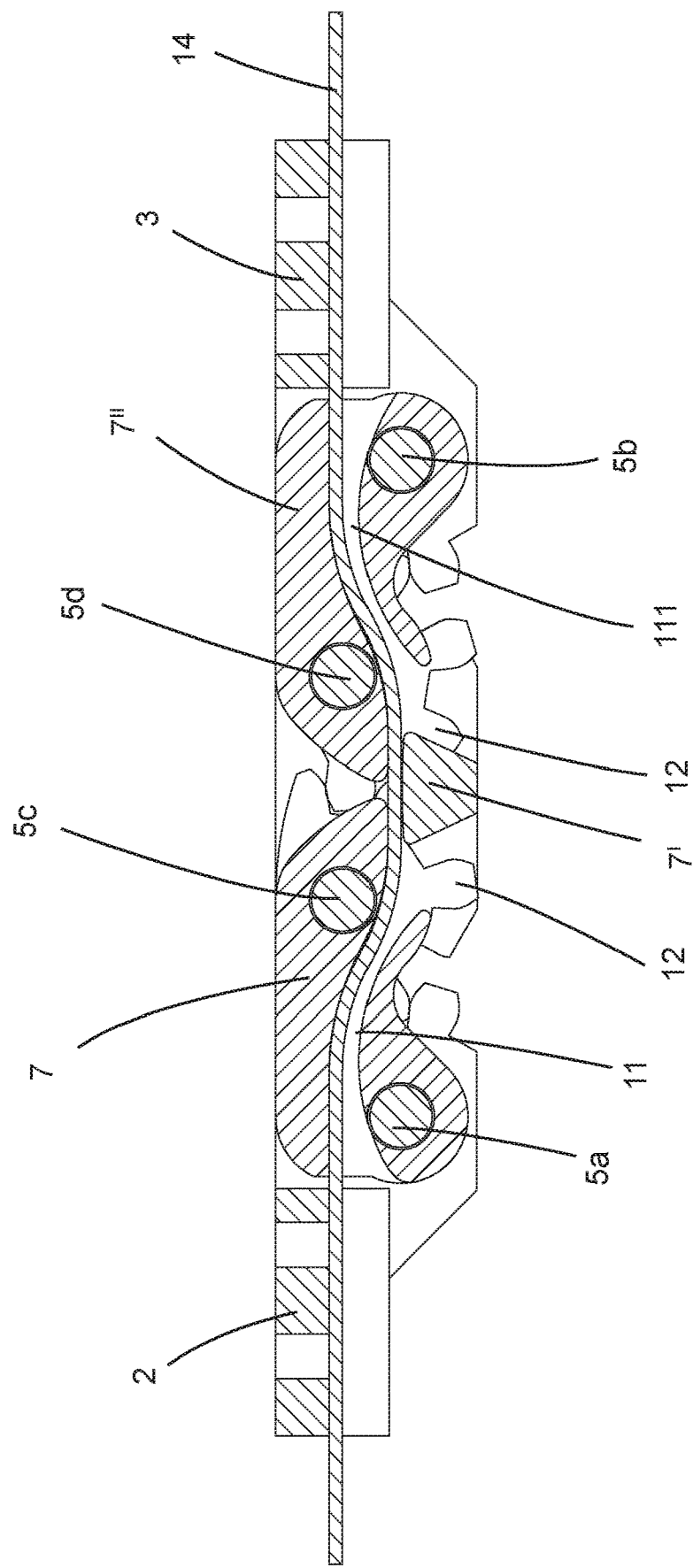

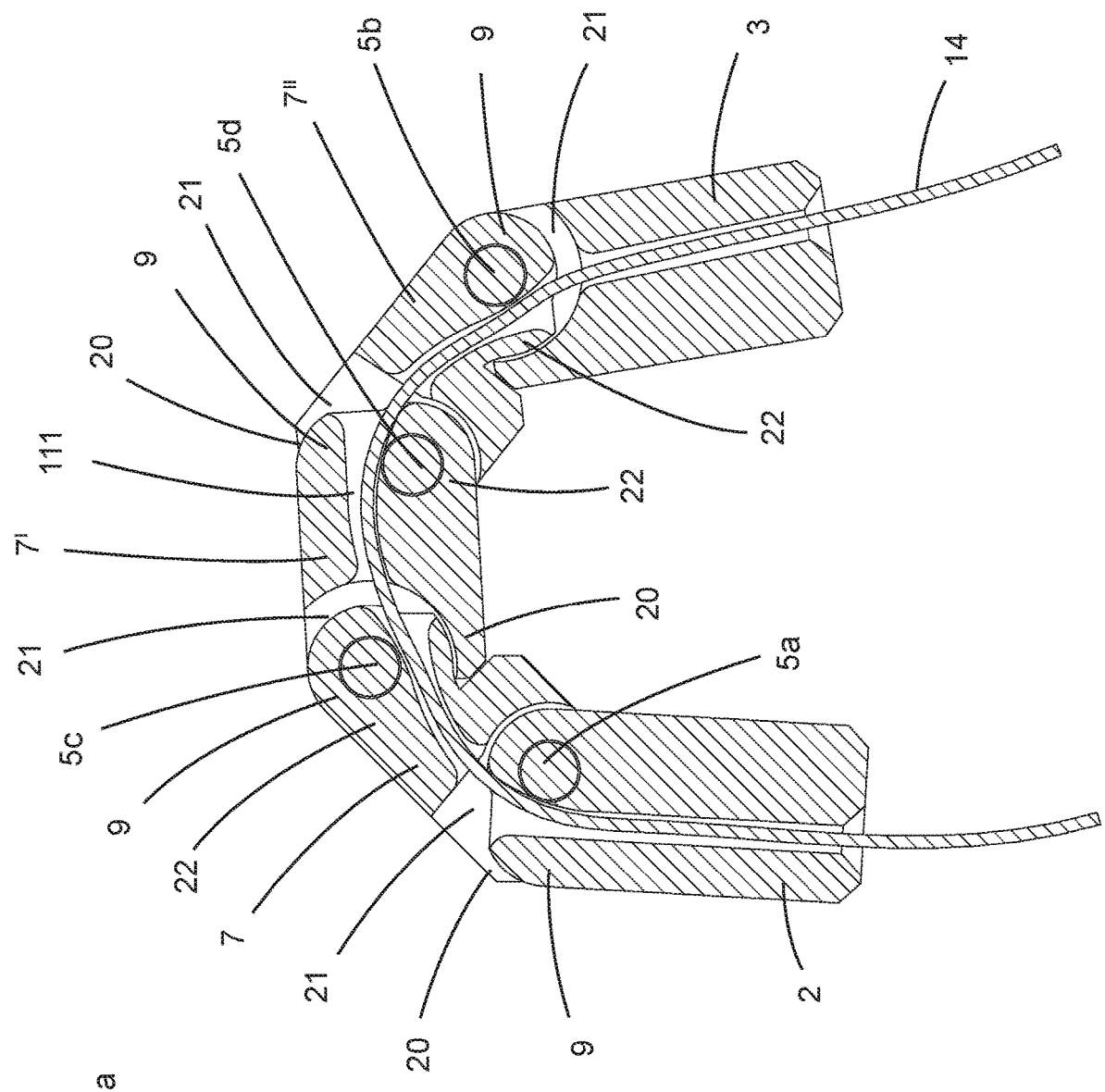

HINGE BETWEEN A FIRST PART AND A SECOND PART IN AN ELECTRICAL DEVICE

The present invention concerns a hinge between a first part and a second part in an electrical device, rendering it possible for the electrical device to be in a use position and a bent position, respectively, preferably wherein at least one electrical cable or electrical wire, for example printed circuit boards (pcb) and flex cable, or optical cable or optical wire, for example optical fibre or light tube, is running between the first part and the second part.

BACKGROUND ART

Many electrical devices require electrical connection between parts connected by a hinge, for example by means of electrical or optical cables or wires. For example, spectacles comprising electronics are previously known. It is for example known to have frames with lenses, which are electrically driven and controlled, that can for example switch between a clear and a tinted mode. For example, when a battery or control circuit is positioned at at least one temple a connecting cable must pass a hinge between the frame and the temple.

Spectacles usually are in either of two positions, a use position when the temples are more or less directed 90 degrees out from the lenses in the frame, and a bent position when the temples are bent via the hinges to rest towards the inside of the frame, more or less parallel to the frame with the lenses.

Several problems arise when having an electrical cable or electrical wire, for example printed circuit boards (pcb) and flex cable, or optical cable or optical wire, for example optical fibre or light tube, (hereafter abbreviated as cable/wire/pcb) reaching between the frame and the temples. First of all, there are mechanical issues of stretching or crinkling of the cable/wire/pcb when changing position between the use and bent position. Also, the bending can be a problem if repeatedly bending occurs with a large deflection angle from the straight position when the temples are in the use position to the bent position. Generally, such as deflection could be up to 90 degrees. These mechanical issues seriously influence adversely the durability of the cable/wire/pcb. A further problem is that the cable/wire/pcb will be seen and be unprotected when the temple is in the bent position.

A way of easing these problems can be found in the proprietor's previous patent application WO 2018/084772.

Further examples of devices having corresponding problems and weaknesses are folding phones, folding laptops and tablets, folding glasses and clip-ons, headphones and smart watches. Obviously, these problems occur in other electrical devices, too, such as hinged displays, lids, doors and so on.

SUMMARY OF THE INVENTION

The present invention aims at solving or at least delimiting these problems. In addition, further problems will also be solved.

According to a first aspect of the invention a hinge is provided between a first part and a second part of an electrical device, rendering it possible for the device to be in a use position and a bent position, respectively, at least one cable/wire/pcb is running between the first part and the second part, the hinge has at least two axes connections, a first axis connection positioned at the first part and a second axis connection positioned at the second part, and therebetween at least one central part, wherein the at least one central part is connected to the first axis connection in a first end and the second axis connection in a second end, or the second end of the central part is connected to a next central part in a first end thereof, which next central part in turn is connected to the second axis connection in a second end thereof, or a next central part and so on until the second axis connection is reached at the second part, wherein the at least one central part is provided with a recess or throughgoing hole going between the first end to its second end for the at least one cable/wire/pcb to run freely in, forming a recess or throughgoing hole through the whole hinge, wherein at least one of said axis connections is situated on a first side of the recess or throughgoing hole and at least one of said axis connections is situated on a second side of the recess or throughgoing hole. With this solution no stretching or crinkling of the cable/wire/pcb when changing position between the use and bent position occurs and the bending of the cable/wire/pcb is minimized.

According to an embodiment of the hinge the at least cable/wire/pcb will bend in radii having centre points on opposite sides of the at least one cable/wire/pcb in the use position in the at least one central part. Preferably, the at least one cable/wire/pcb will be less bent or deflected in each point in the hinge than the second part will be deflected from the first part in the use position to the bent position.

According to an embodiment of the hinge the recess or throughgoing hole of a central part has a main curvature having a radius with a centre point on an inner side, i.e., the same side of the hinge as a decreased angle occurs between the first part and the second part in the bent position.

According to an embodiment of the hinge a wall of the inner side of the central part towards the recess or throughgoing hole has a radius corresponding to a neutral bending plane of the hinge for the at least one cable/wire/pcb to rest against in the bent position. Thus, the cable/wire/pcb will be controlled in its bending movement.

According to an embodiment of the hinge the recess or throughgoing hole is wider in its first and second end of the at least one central part to allow the at least one cable/wire/pcb to rest against a wall towards an outer side of the hinge in the use position, allowing for two opposite bends of the at least one cable/wire/pcb. This will provide a possibility of bending the hinge into a bent position without causing as large bending on the cable/wire/pcb. Further, it is possible to provide a slimmer hinge seen in a direction from the outside to the inside of the hinge.

According to an embodiment of the hinge the first part has a middle portion protruding in between two fork portions at first end of a central part, the central part having a middle portion in a second end thereof, which in turn protrudes in between fork portions of the second part or a next central part and so on; or vice versa; or every second central part having a middle portion in both ends and every second central part having fork portions in both ends.

According to an embodiment of the hinge each axis connection is provided with an axle going through both fork portions and the cooperating middle portion. Preferably, each connection axle is a screw which goes through a first fork portion and the middle portion freely and grip into a second fork portion with engaging threads.

According to an embodiment of the hinge the first part and the second part has corresponding cogs, which in case of one central part are meshing with each other at the hinge for a controlled movement between the use and the bent position, in case of more than one central part the first part has cogs meshing with cogs provided at the first end of the next central part, the first central part has cogs in the second end meshing with cogs at the second part, or a further central part and so on up to the second part, wherein the parts are meshing pairwise with every second part. Thus, the movement between the use position and bent position is totally controlled.

According to a second aspect of the invention spectacles, such as AR/VR/MR or smart headsets or eyewear; smart phones, laptops, tablets or screen to screen/screen to keyboard devices; smart bracelets or smart watches; antennas to device foldable connections; foldable over the head headphones; screen to device, such as foldable screen to cameras; robotic arms, prosthetic devices; swingarms for electrical motorcycles or mopeds comprising at least one hinge according to the above first aspect of the invention are provided.

A neutral bending plane is a plane where the traction and compression load is zero during a bending of a piece of material. On the outer side of the bent material a traction load occurs and on the inner side of the bent material a compression load occurs. The two loads diminish as we look into the material until the neutral bending plane is reached. An aim of the present invention is to bend the cable/wire/pcb along the neutral bending plane in the at least one central part. Thus, the at least cable/wire/pcb will have a length between a predetermined position in the first part and a predetermined position in the second part corresponding to the length along the first part, hinge and second part between the predetermined positions in the use position, i.e., no excessive length is present for compensating for the bending at the hinge into the bent position.

SHORT DESCRIPTION OF THE APPENDED DRAWING

The present invention will now be described in more detail under referral to the appended drawing, in which:

FIG. 2d shows an embodiment of a central part of a hinge of the present invention in a use position, orthogonally to the axis connections in a cross-sectional view.

FIG. 5b shows a perspective view of the embodiment of FIG. 5a.

FIG. 6c shows the embodiment of FIG. 6a in a cross-sectional view orthogonally to the axis connections in a use position.

FIG. 9a shows an embodiment of the hinge of the present invention having several central parts, in a cross-sectional view, orthogonally to the axis connections.

DETAILED DESCRIPTION OF EMBODIMENTS OF THE INVENTION

References to upper, lower, inner, outer and so on are referring to electrical devices in a use position, such as for spectacles when a person is wearing the spectacles, looking through the lenses, standing up straight or for a laptop when it is standing on a surface in an open position, in any desired angle, i.e., a use position for the cable/wire/pcb. Sides of parts facing other parts, when in a bent position, are inner sides and the opposite are outer sides. Sides facing the ground are lower sides and the opposite upper sides. A hinge according to the present invention may be embedded inside the electrical device, i.e., between inner and outer sides of a first part and a second part, respectively.

Several problems arise when having at least one cable/wire/pcb reaching between a first part and a second part in an electrical device. First of all, there is mechanical issues of stretching or crinkling of the at least one cable/wire/pcb when changing position between the use and bent position. Also, the bending can be a problem if repeatedly bending occurs with a large deflection angle from a straight position when in the use position to the bent position. Generally, such as deflection could be up to 180 degrees. These mechanical issues seriously influence adversely the durability of the at least one cable/wire/pcb.

Figure 1:
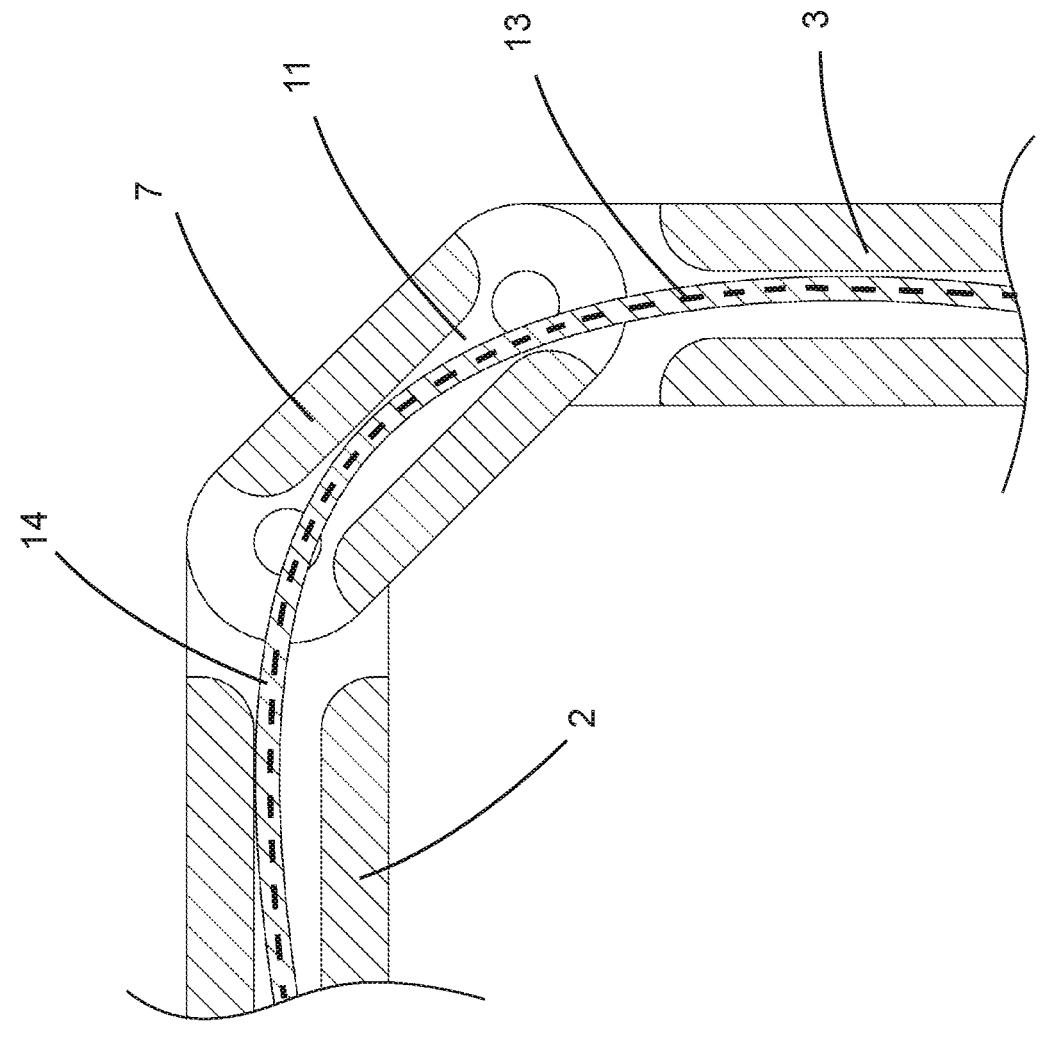
FIG. 1 shows the functionality of a neutral bending plane through a hinge according to known art, orthogonally to the axis connections.

An electrical cable or electrical wire, for example printed circuit boards (pcb) and flex cable, or optical cable or optical wire, for example optical fibre or light tube, (hereafter abbreviated as cable/wire/pcb), is running between the first part 2 and the second part 3, See FIG. 1, but cable/wire/pcb 14 is not stretched in the bent position nor crinkled in the use position. The cable/wire/pcb 14 has a length between a predetermined position in the first part 2 and a predetermined position in the second part 3 in the bent position corresponding to the length along the first part 2, hinge 4 and second part 3 between the predetermined positions in the use position, i.e. no excessive length for compensating for the bending at the hinge 4 into the bent position. The length is always the same between the predetermined positions.

As previously described in WO 2018/084772 a way to provide this is to let the cable/wire/pcb 14 to follow a thought neutral bending plane 13 through the hinge 4, see FIG. 1. According to mechanics when bending a beam, the outer surface will be stretched, and the inner surface will be pressed. In between there is a neutral plane not being affected by the stretching or pressing forces. This forms the basis of the solution. By letting the cable/wire/pcb 14 follow this neutral bending plane 13 as much as possible the cable/wire/pcb 14 will not be affected by stretching forces nor crinkling forces of the first part 2, hinge 4 and second 3. Of course, the at least one cable/wire/pcb 14 will in itself be affected when it is bent but when seen in the perspective of the electrical device it will be more or less unaffected. The cable/wire/pcb 14 may pass in and out through this plane but generally following it through the hinge 4. Preferably, the cable/wire/pcb 14 will be less bent or deflected in each point in the hinge 4 than the first part 2 will be deflected from the second part 3 in the use position to the bent position.

From WO 2018/084772 it is described that preferably the cable/wire/pcb 14 will be bent or deflected in the hinge 4 from a straight position less than 45 degrees, preferably less than 40 degrees and most preferred less than 35 degrees in any point through the hinge at the bent position, as can be seen in FIG. 1. If space is provided for the cable/wire/pcb 14 through the hinge 4 it may straighten out the bends being situated at the outer wall in the first part 2, passing the apex (inner wall) of the bend between the first part 2 and a central part 7 and running to the outer wall of a recess or a throughgoing hole 11 in the central part 7, back to the apex of the bend between the central part 7 and the second part 3 and outwards towards the outer wall of the second part 3.

The present invention will be described by different embodiments starting with an embodiment having one central part. Thereafter, further embodiments having two or more central parts will be described.

A recess or throughgoing hole 111 is going through the whole hinge 4, through which at least one cable, for example a cable/wire/pcb 14 is going. See FIG. 2*a* where a cut away view is shown in a plane parallel with axis (hinge) connections 5*a*, 5*b*. Through the central part 7 a portion 11 of the throughgoing hole 111 extends from a first end 20 to a second end 22 of the central part 7. The recess or throughgoing hole 111 passes between the first axis connection 5*a*, situated at the first end 20, and the second axis connection 5*b*, situated at the second end 22, so that the first axis connection 5*a* is on a first side of the throughgoing hole 111 and the second axis connection 5*b* is on a second side of the throughgoing hole 111. Instead of a throughgoing hole 111 it is conceivable to have a recess on the outer side or the inner side (not shown). The cable/wire/pcb 14 run freely in the throughgoing hole or recess 111.

Figure 2A:
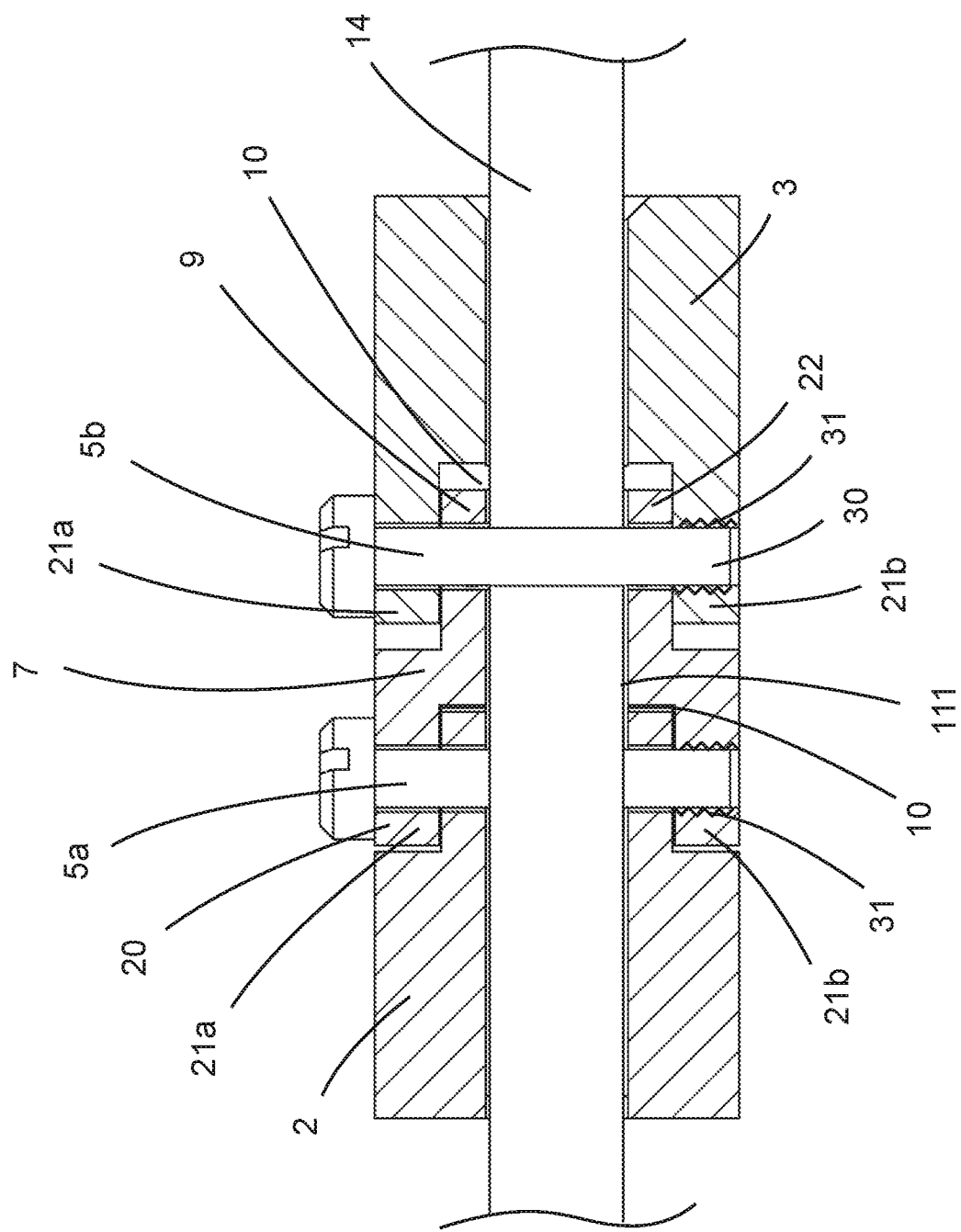
FIG. 2a shows an embodiment of a central part of a hinge of the present invention in a cut-away view from an inner side.

The central part 7 in the embodiment of FIG. 2*a* has a middle portion 9 protruding from one end 22 facing the second part 3 (or alternatively the first part 2. The middle portion 9 may cooperate with a recess 10 between two fork portions 21 in the second part 3 (or alternatively the first part 2) so that the central part 7 will not slide out of the hinge 4. On the opposite end 20, the central part 7 may have a recess 10 between fork portions 21 cooperating with a middle portion 9 in the first part 2 (or alternatively the second part 3). It is of course conceivable to provide the central 7 part with only middle portions 9 or only recesses 10 and fork portions 21, and thus the opposite form in the first part 2 and the second part 3, or a mix thereof. The central part 7 may be in one piece or made up by two or more pieces. The axis connection may be any kind of axle 30, such as a rivet or a screw, each axle 30 being in one or more pieces. Preferably, each axis connection is provided by means of an axle 30 going through both fork portions 21 and the cooperating middle portion 9. In one embodiment each connection axle 30 is a screw which goes through a first fork portion 21*a* and the middle portion 9 freely and grip into a second fork portion 21*b* with engaging threads 31.

Figure 2B:
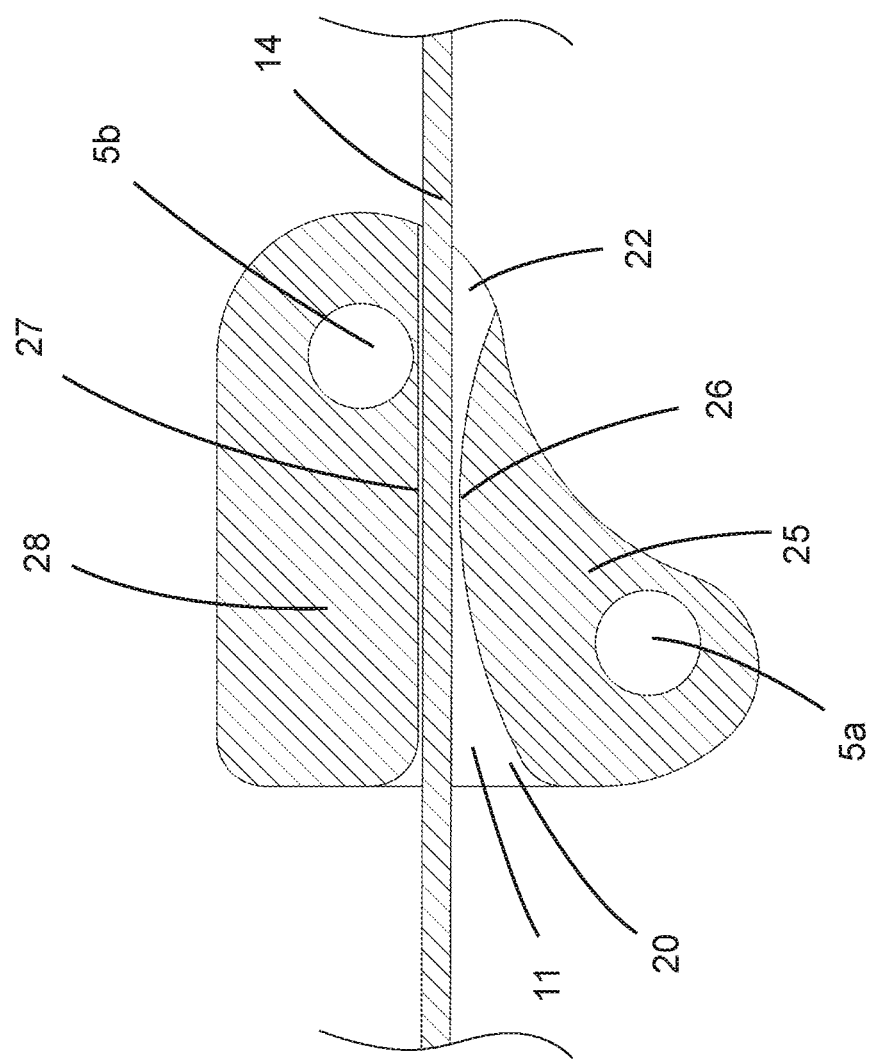
FIG. 2b shows an embodiment of a central part of a hinge of the present invention in a use position, orthogonally to the axis connections in a cross-sectional view.

In FIG. 2*b* the central part 7 is shown in a cut away view orthogonally to the axis connections 5*a*, 5*b*, in a use position, in this case with the cable/wire/pcb 14 in a straight position. The hinge axis 5*a* is positioned in the first end 20 of the central part 7 and the hinge axis 5*b* is positioned in the second end 22 of the central part 7. A recess or throughgoing hole 11 (a portion of the whole recess or throughgoing hole 111) runs in between the two hinge axes 5*a*, 5*b* so that the axes are situated on opposite sides of the throughgoing hole 11. The recess or throughgoing hole 11 allow the cable/wire/pcb 14 to rest against a wall 27 on an outer side 28 of the hinge 4 in the use position. The wall 27 in the shown embodiment is more or less straight.

Figure 2C:
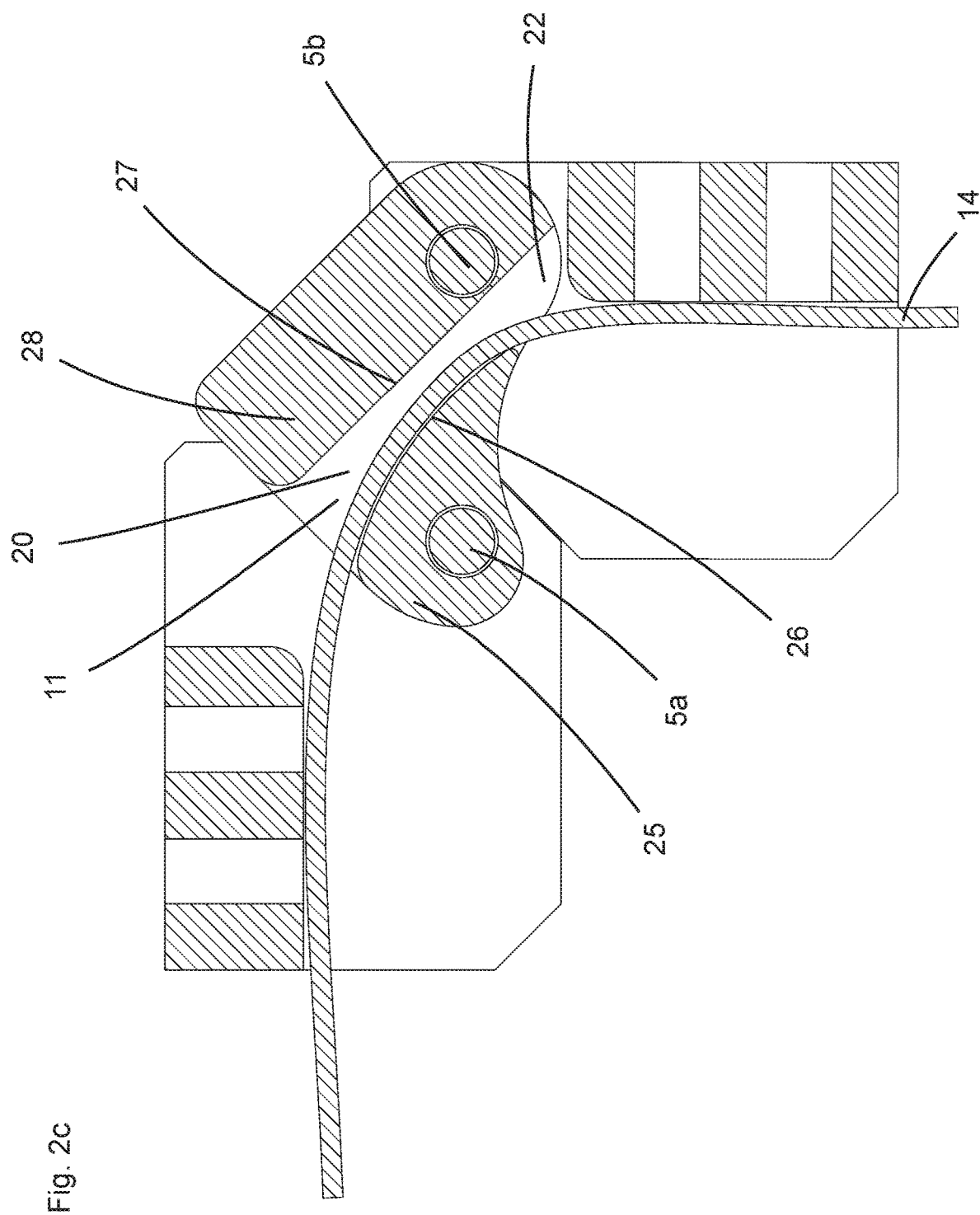
FIG. 2c shows the embodiment of FIG. 2b in a bent position, orthogonally to the axis connections in a cross-sectional view.

In FIG. 2*c* the embodiment of FIG. 2*b* is shown in a bent position. A wall 26 on the inner side 25 of the hinge 4 towards the recess or throughgoing hole 11 has a radius corresponding to a neutral bending plane 13 of the hinge 4 for the cable/wire/pcb 14 to rest against in the bent position. The wall 26 has a curvature with a radius 24 having a centre point situated outside of the hinge 4 on the inner side 25 of the hinge 4, i.e. the same side of the hinge 4 as a decrease in angle occurs between the first part 2 and the second part 3 in the bent position. This will provide a controlled bending of the cable/wire/pcb 14.

The cable/wire/pcb 14 may freely move in the recess or throughgoing hole 11 but will be controlled by the walls 26, 27 and will move from one wall to the other during the bending or opening of the hinge 4 to provide the desired bending in each end position, use and bent positions, and therebetween.

In FIG. 2*d* the central part 7 is shown in a cut away view orthogonally to the hinge axes 5*a*, 5*b*, in a use position. In this case the cable/wire/pcb 14 actually is pre-bent in an opposite direction, see description below. This will provide a possibility of bending the hinge into a bent position without causing as large bending on the cable/wire/pcb 14. Further, it is possible to provide a slimmer hinge 4 seen in a direction from the outside to the inside of the hinge 4. The hinge axis 5*a* is positioned in a first end 20 of the central part 7 and the hinge axis 5*b* is positioned in a second end 22 of the central part 7. The recess or throughgoing hole 11 runs in between the two hinge axes 5*a*, 5*b* so that the axes are situated on opposite sides of the recess or throughgoing hole 11, as well as on each side of the recess or throughgoing hole 111 of the hinge 4. A main portion 23, in the middle portion at least, of the throughgoing hole 11 has a curvature with a radius 24 having a centre point situated outside of the hinge 4 of the inner side 25 of the hinge 4, i.e. the same side of the hinge 4 as a decrease in angle occurs between the first part 2 and the second part 3 in the bent position. In the same way as in the embodiment of FIG. 2*b*, a wall 26 on the inner side 25 of the hinge 4 towards the recess or throughgoing hole 11 has a radius corresponding to a neutral bending plane 13 of the hinge 4 for the cable/wire/pcb 14 to rest against in the bent position.

The recess or throughgoing hole 11 is wider in its first 20 and second 22 end to allow the cable/wire/pcb 14 to rest against a wall 27 on an outer side 28 of the hinge 4 in the use position. In the use position the cable/wire/pcb 14 will come into the first end 20 in a straight fashion and then bend around the first hinge axis 5*a*, i.e. having a curvature with a radius having its centre point on the same side as the axis 5*a*. See FIG. 2*d*. The cable/wire/pcb 14 will follow the wall 27 and its bend. Thereafter, towards the second end 22, the cable/wire/pcb 14 will instead be able to bend around the second axis 5*b*, which axis 5*b* is positioned on a second side of the recess or throughgoing hole 11 compared to the first axis 5*a*, situated on a first side of the recess or throughgoing hole 11. I.e. the cable/wire/pcb 14 will have a curvature with a radius 32 having a centre point at the same side as the axis 5*b*. The cable/wire/pcb 14 will still follow the wall 27 and its bend. The wider openings in the first end 20 and second end 22, respectively, allow for two opposite bends of the cable/wire/pcb 14 in the use position.

The cable/wire/pcb 14 may freely move in the recess or throughgoing hole 11 but will be controlled by the walls 26, 27 and will move from one wall to the other during the bending or opening of the hinge 4 to provide the desired bending in each end position, use and bent positions, and therebetween.

3*a*-*d* an embodiment is shown where the central part 7 has a middle portion 9 at both ends cooperating with recesses 10 between fork portions 21 on both the first part 2, and the second part 3 The fork portions 21 of the first part 2 and the second part 3, respectively, reach over portions of the central part 7. In this embodiment the upper fork portion 21*a* of the first part 2 is provided with cogs 12 meshing with cogs 12 on the upper fork portion 21*a* of the second part 3. In this embodiment, also the lower fork portions 21*b* are provided with meshing cogs 12. Because of the meshing cogs 12 a controlled movement may be performed between the use and bent positions, respectively.

Figure 3A:
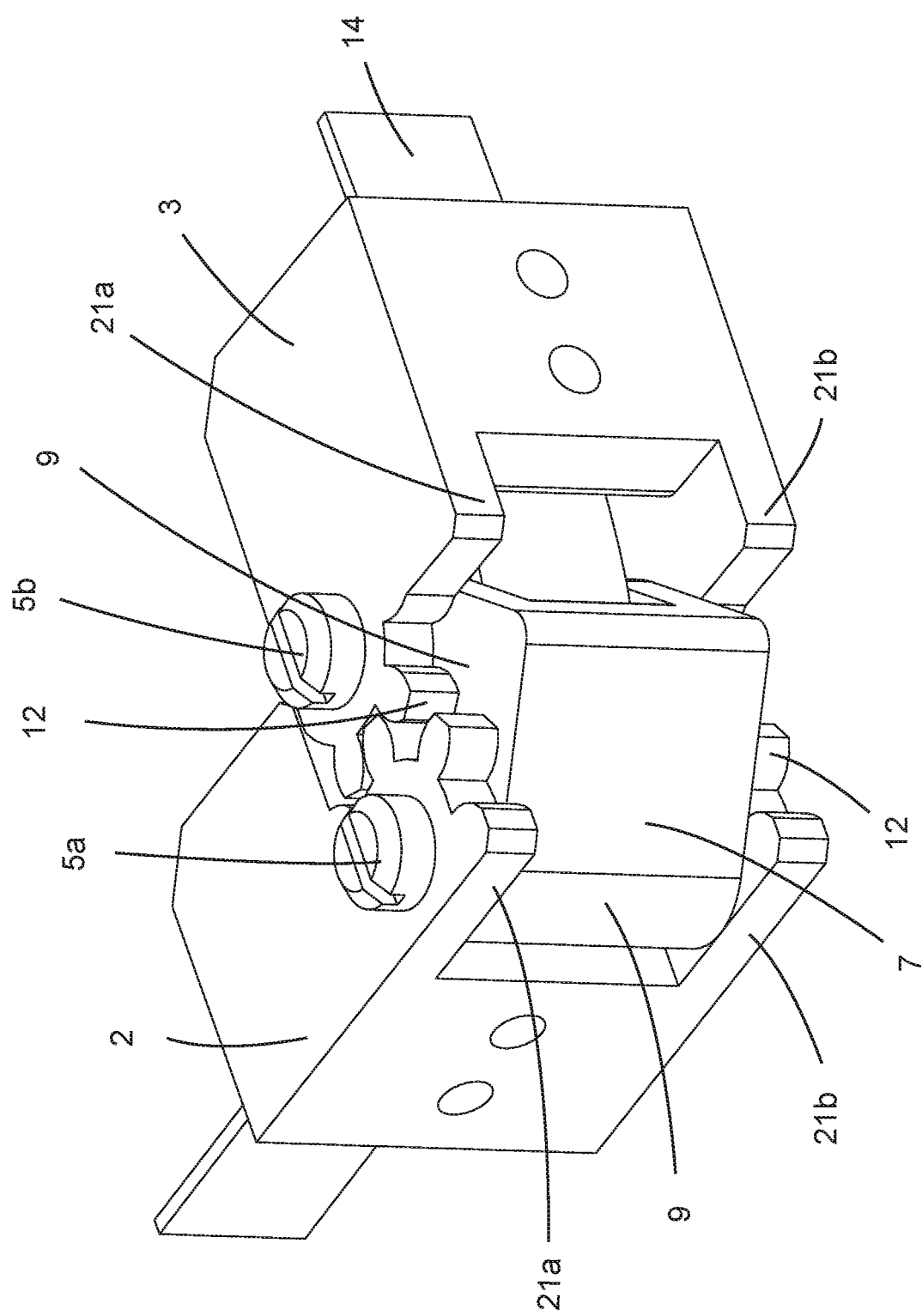
FIG. 3a shows an embodiment of a hinge of the present invention having meshing cogs in a bent position, in a perspective view from the outside.
Figure 3B:
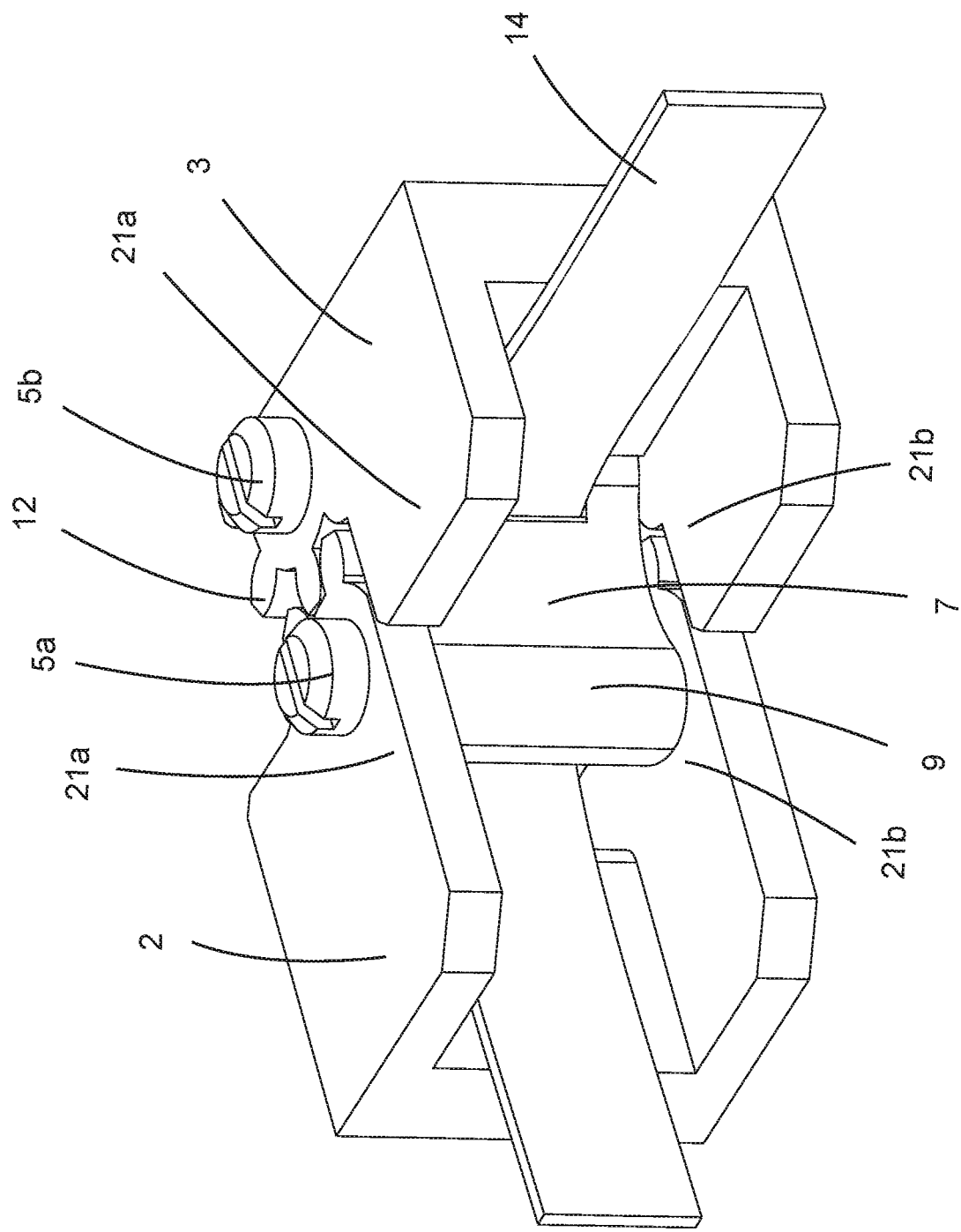
FIG. 3b shows an embodiment of a hinge of the present invention having meshing cogs in a bent position, in a perspective view from the inside.
Figure 3C:
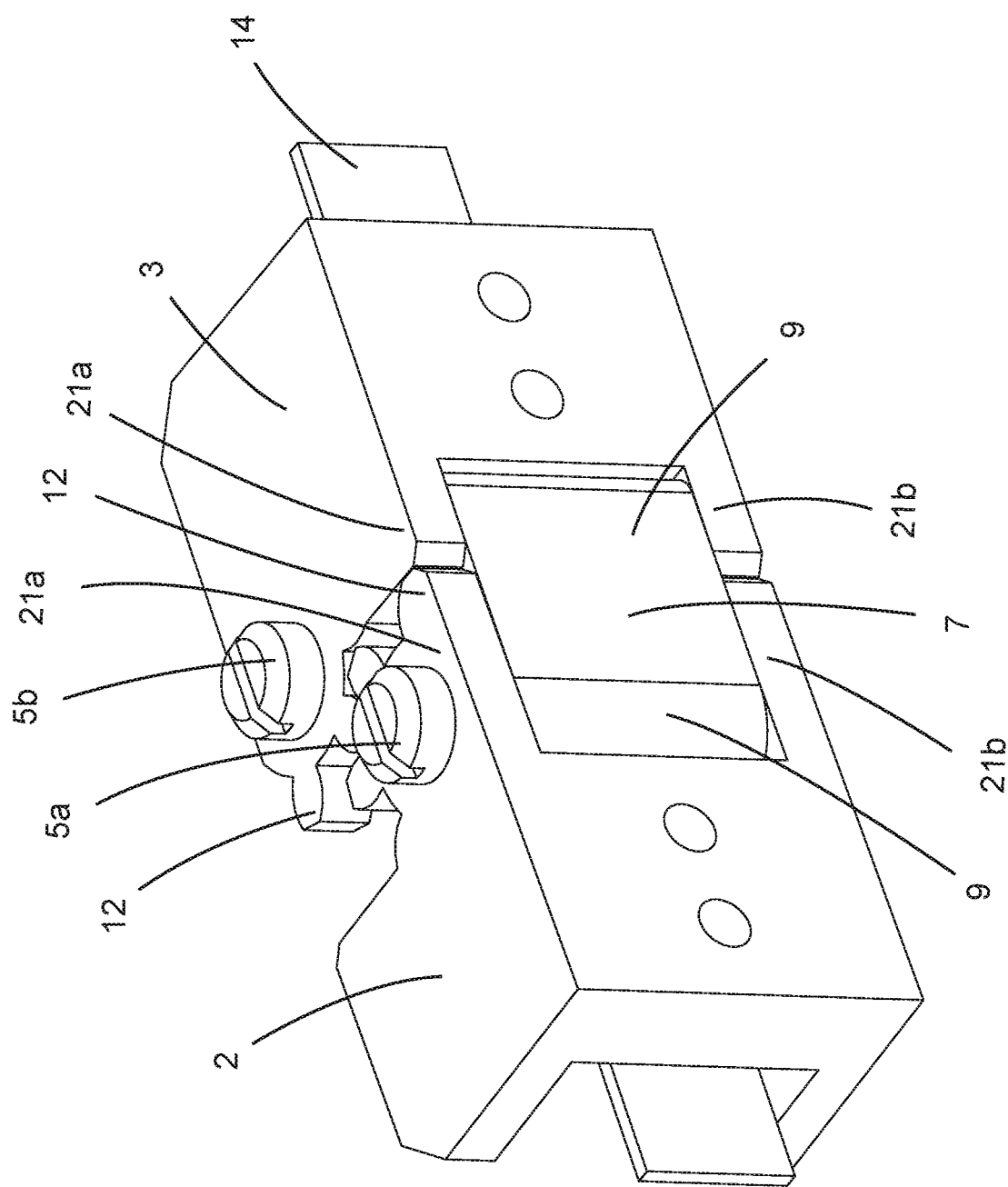
FIG. 3c shows an embodiment of a hinge of the present invention having meshing cogs in a use position, in a perspective view from the outside.
Figure 3D:
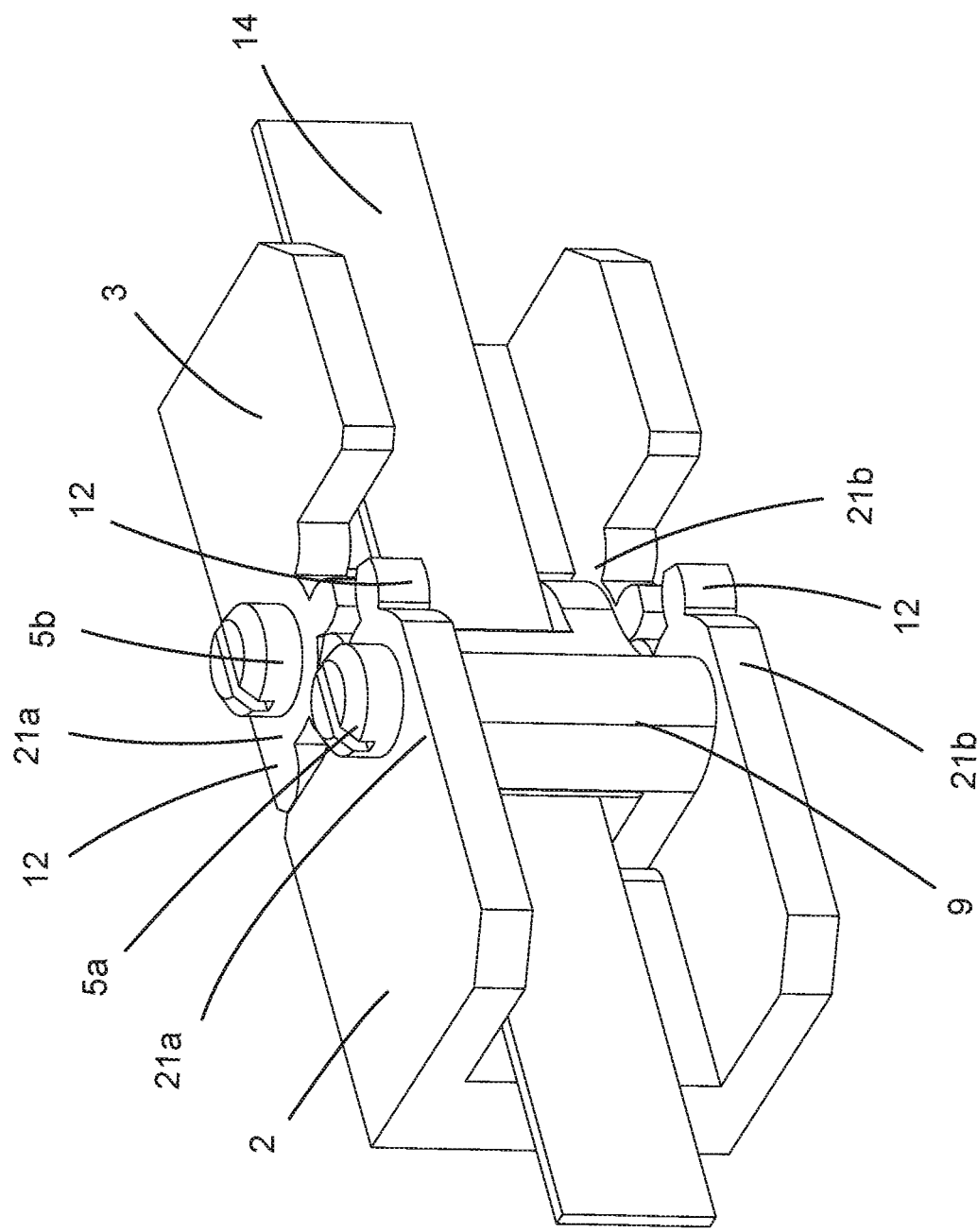
FIG. 3d shows an embodiment of a hinge of the present invention having meshing cogs in a use position, in a perspective view from the inside.
Figure 4A:
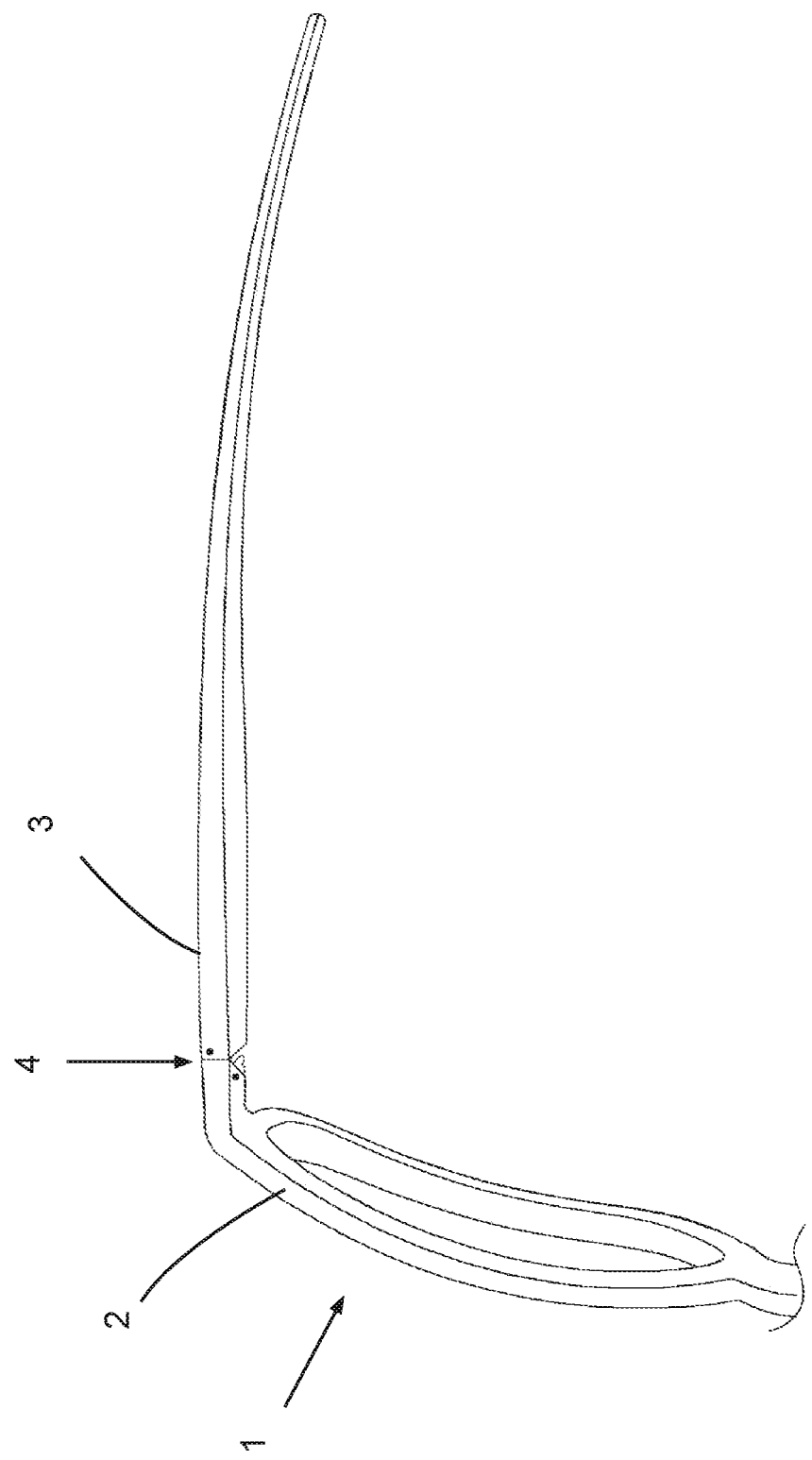
FIG. 4a shows a portion of a spectacle having a frame and a temple, in a use position, from above.

In FIG. 3*a* an embodiment of the hinge 4 is shown in the bent position from the outside ready to be installed in a product. Thus, the hinge 4 may be a separate device, which could be attached in a product when it is desirable to have a hidden or embedded hinge. In FIG. 4*a* an example of use is shown, where the outer sides of a frame 2 and temple 3 are arranged. In the bent position, the cable 14 is well protected. It gives also the spectacles a neat appearance.

According to one aspect of the invention, the inventive hinge may be used in spectacles comprising electronics having frames with lenses, which are electrically driven and controlled. For example, the lenses may switch between a clear and a tinted mode, be a LC lens or AR/VR/MR display and may comprise at least one cable/wire/pcb. For example, when a battery or control circuit is positioned at at least one temple at least one connecting cable/wire/pcb must pass a hinge between the frame and the temple.

Figure 4B:
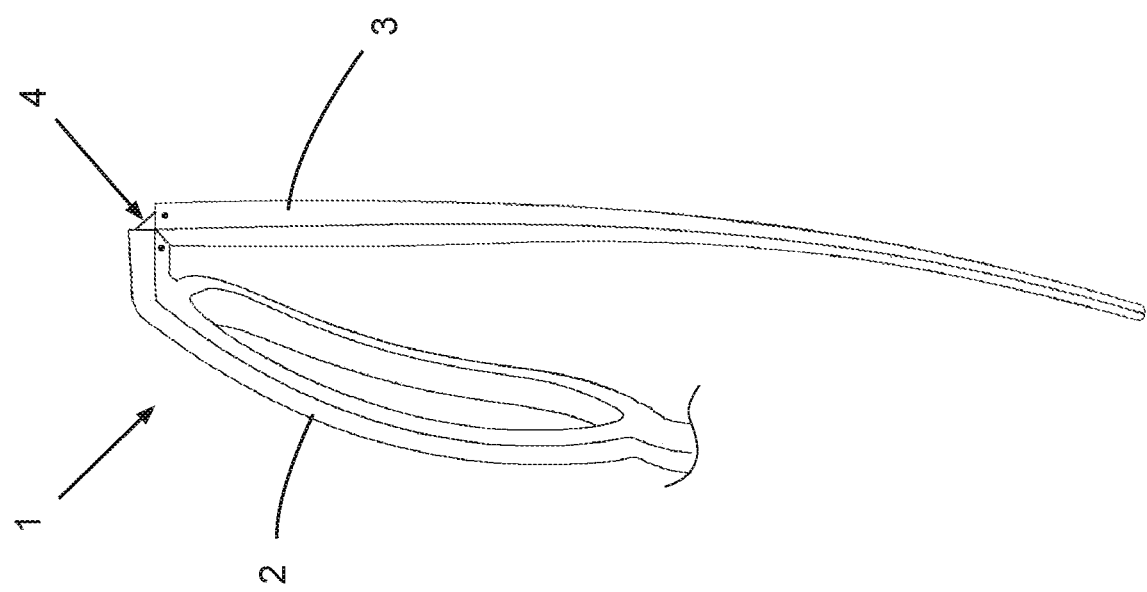
FIG. 4b shows a portion of a spectacle having a frame and a temple, in a bent position, from above.
Figure 4C:
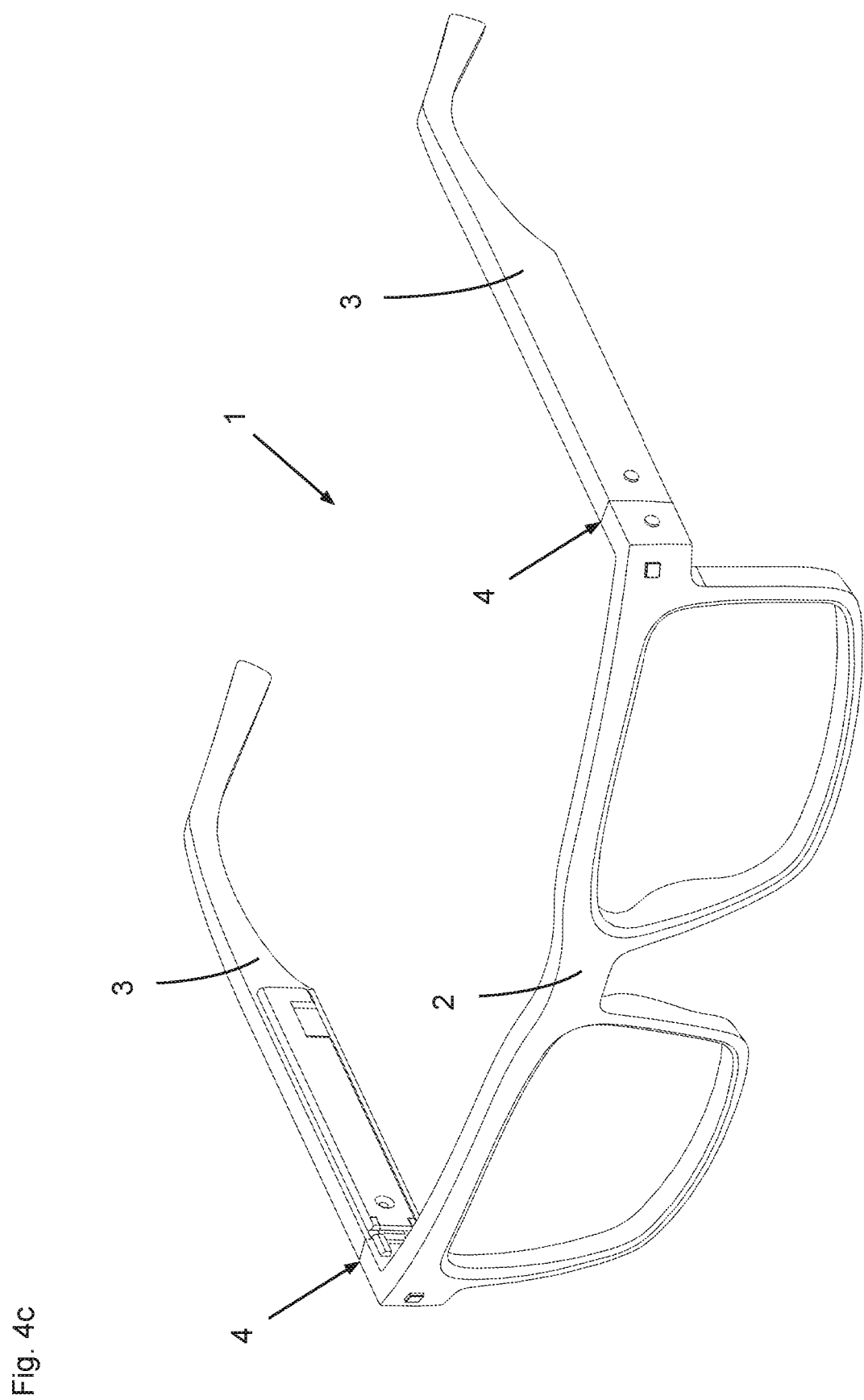
FIG. 4c shows an embodiment of a spectacle of the present invention in a perspective view.

In FIGS. 4*a* and *b* a portion of an electrical device 1, in this embodiment spectacles 1, is shown having a first part 2, i.e. a frame 2, and a second part 3, i.e. a temple 3, and there between an embodiment of a hinge 4 of the invention, which is embedded in the frame 2 and temple 3 when the temple 3 is in a use position as shown in FIG. 4*a*. In FIG. 4*b* the temple 3 is in a bent position. In the use position the spectacles are wearable and in the bent position they are not in use. In FIG. 4*c* the spectacles 1 are shown in full in a perspective view. The hinge 4 may be of any embodiment as described above.

An application of the inventive hinge 4 having one central part 7 have been described in detail. It is conceivable for the skilled person to arrange this inventive hinge 4 in many different applications. Now different embodiments will be described having two central parts 7, 7'.

Figure 5A:
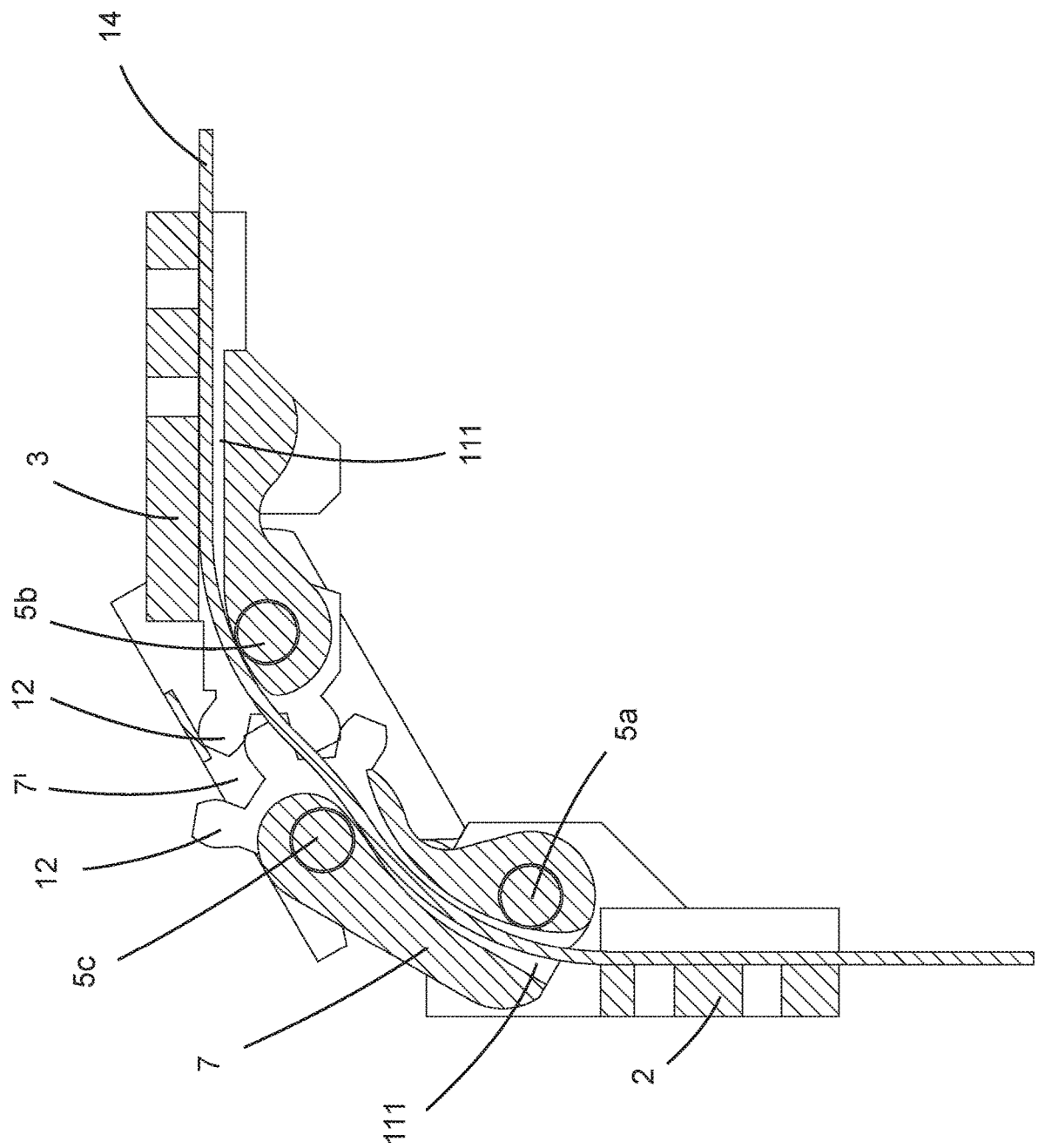
FIG. 5a shows an embodiment of a hinge of the present invention in a cross-sectional view having two central parts and meshing cogs, orthogonally to the axis connections.

In FIG. 5*a* a hinge 4 having two central parts 7, 7' is shown in a cross-sectional view. Having two central parts 7, 7' will reduce the bending of a cable/wire/pcb 14 going through the hinge 4 and allow a larger angular difference between the use position and the bent position between the first part 2 and the second part 3. For example, it would be possible to have an angular difference of 180 degrees between a use position and a bent position. Each of the central parts 7, 7' may be of any of the above-described embodiments.

The different parts 2, 3, 7, 7' connects with each other by means of a middle portion 9 protruding from the part and a recess 10 between two fork portion 21*a*, *b* of the next part. According to one example the first part 2 has a fork portion 21, and the central part 7 has a middle portion 9 in its first end 20 as well as in its second end 22. See FIG. 5*b*. The next central part 7' has a fork portion 21 in its first end 20 as well as in its second end 22. Thus, the second part 3 has a middle portion 9. According to another example, the first part 2 may have a middle portion 9 and the central part 7 has a fork portion 21 in its first end 20 and a middle portion 9 in its second end 22. The next central part 7' has a fork portion 21 in its first end 20 and a middle portion 9 in its second end 22. Thus, the second part 3 has a fork portion 21. In this example each central part is designed in the same manner.

The recess or throughgoing hole 111 through the whole hinge 4 is situated so that at least one of the axis connections 5*a*, 5*b*, 5*c* is situated on a first side and at least one of the axis connections 5*a*, 5*b*, 5*c* is situated on a second side of the recess or throughgoing hole 111, as has been described above. In one embodiment shown in FIG. 5*a* the first axis connection 5*a* is situated on the inner side of the hinge 4, in line with the axis connection 5*a* of the central part 7, in its first end 20 also on the inner side 25 of the central part 7, i.e., on the side of the recess or throughgoing hole 111 which faces the sides of the first part 2 and second part 3 which will meet in a bent position. In the second end 22 of the central part 7, on the opposite side of the recess or throughgoing hole 111, the axis connection 5*c* is provided on the outer side 28 of the central part 7. In the next central part 7' the axis connection 5*c* goes through the first end 20 of the next central part 7' on the outer side 28 of the recess or throughgoing hole 111. In the second end 22 of the next central part 7' the second axis connection 5*b* is positioned on the inner side 25 of the next central part 7'. At the second part 3 the second axis connection 5*b* is also on the inner side of the hinge 4. Obviously, it is possible to arrange the axis connections vice versa.

Figure 5B:
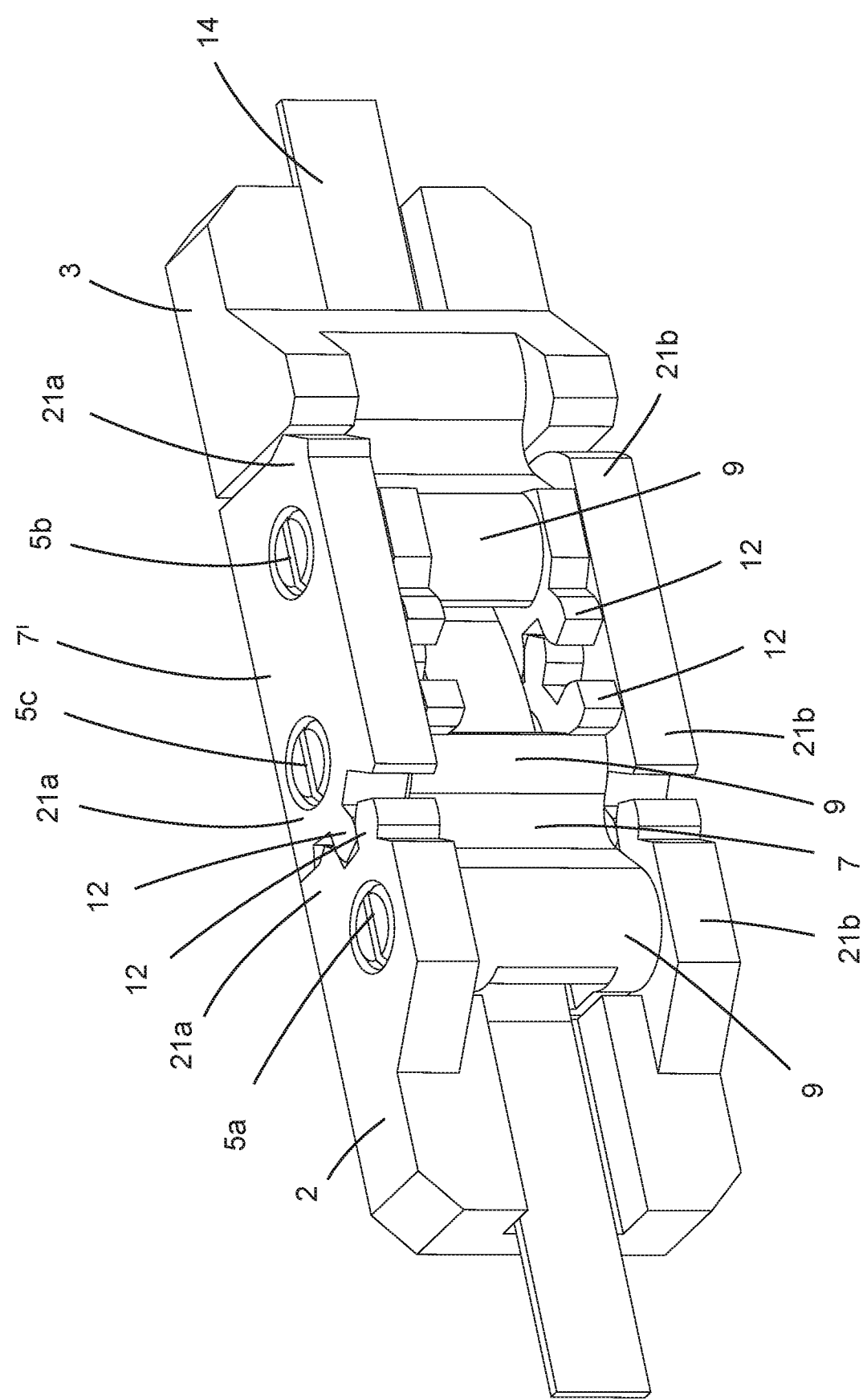

In case a further controlled bending in the hinge 4 is required or desired, cogs 12 could be used in an embodiment with two central parts 7, 7'. One embodiment is shown in FIG. 5*b* where a first part 2 has fork portions 21 provided with cogs 12 in their ends. The central part 7 has a middle portion 9 in its first end 20 which protrudes into the recess 10 between the fork portions 21 of the first part 2. In the second end 22 of the central part 7 a middle portion 9 is provided having cogs 12, and the middle portion 9 goes into a recess 10 between fork portions 21 of the next central part 7'. The fork portions 21 in the first end 20 of the next central part 7' are provided with cogs 12 which mesh with the cogs 12 of the first part 2. The second part 3 has a middle portion 9 which goes into the recess 10 between the fork portion 21 in the second end 22 of the next central part 7'. The middle part 9 of the second part 3 is provided with cogs 12 which mesh with the cogs 12 on the second end 2 on the central part 7. Obviously, it could be vice versa. But every second part will mesh with each other. In the shown case the first part 2 and the next central part 7' mesh with each other; and the central part 7 and the second part 3 mesh with each other. Having meshing cogs 12 will control the bending so that the same amount of bending occurs around each axis connection 5a, 5b, 5c. Each central part may be of the same embodiment or mixed embodiments as described above referring to FIGS. 2b-2d.

Figure 8A:
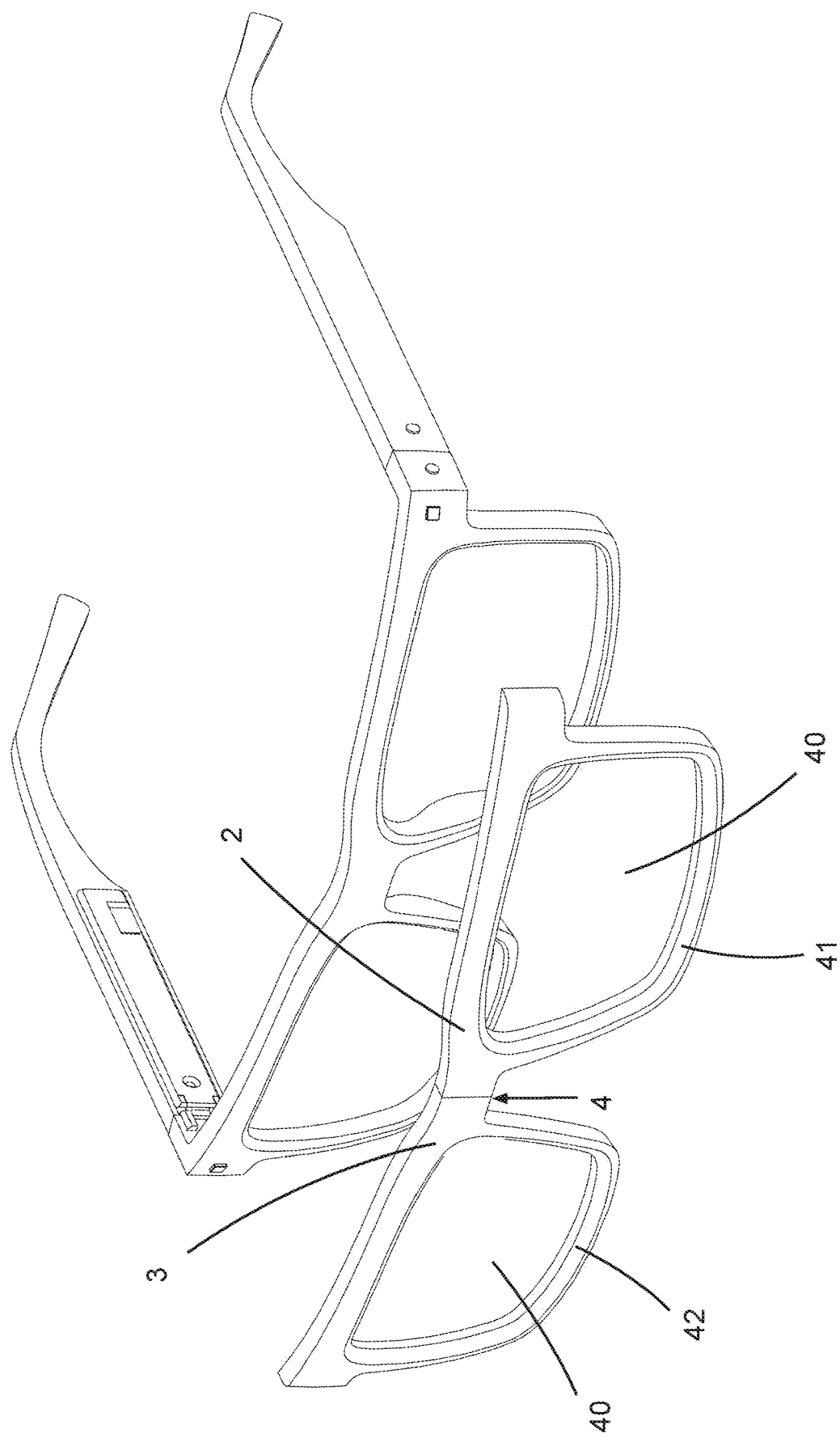
FIG. 8a shows an embodiment of a foldable clip-on for spectacles.

In FIG. 8a a foldable clip-on for spectacles is shown. It may for example provide tinting lenses, LC lenses or AR/VRMR displays and thus has a cable/wire/pcb 14 going through the hinge 4 at the nose portion of a frame of the clip-on. In the use position the clip-on is more or less flat and ready for use and the cable/wire/pcb 14 goes straight through the hinge 4. In the bent position the two lenses 40 come together in a parallel position. A first part 2 of the clip-on is provided by a frame portion for a left eye lens 41 and a second part 3 of the clip-on is provided by a frame portion for a right eye lens 42. The first part 2 has a first axis connection 5a adapted to connect with a first end 20 of a central part 7. The central part has an axis connection 5c at its second end 22 which in turn connects with a next central part 7'. The next central part 7' connects with a second axis connection 5b provided at the second part 3.

Now an embodiment comprising three central parts will be described. This would further increase the possibility to bend the hinge, even more than 180 degrees.

Figure 6A:
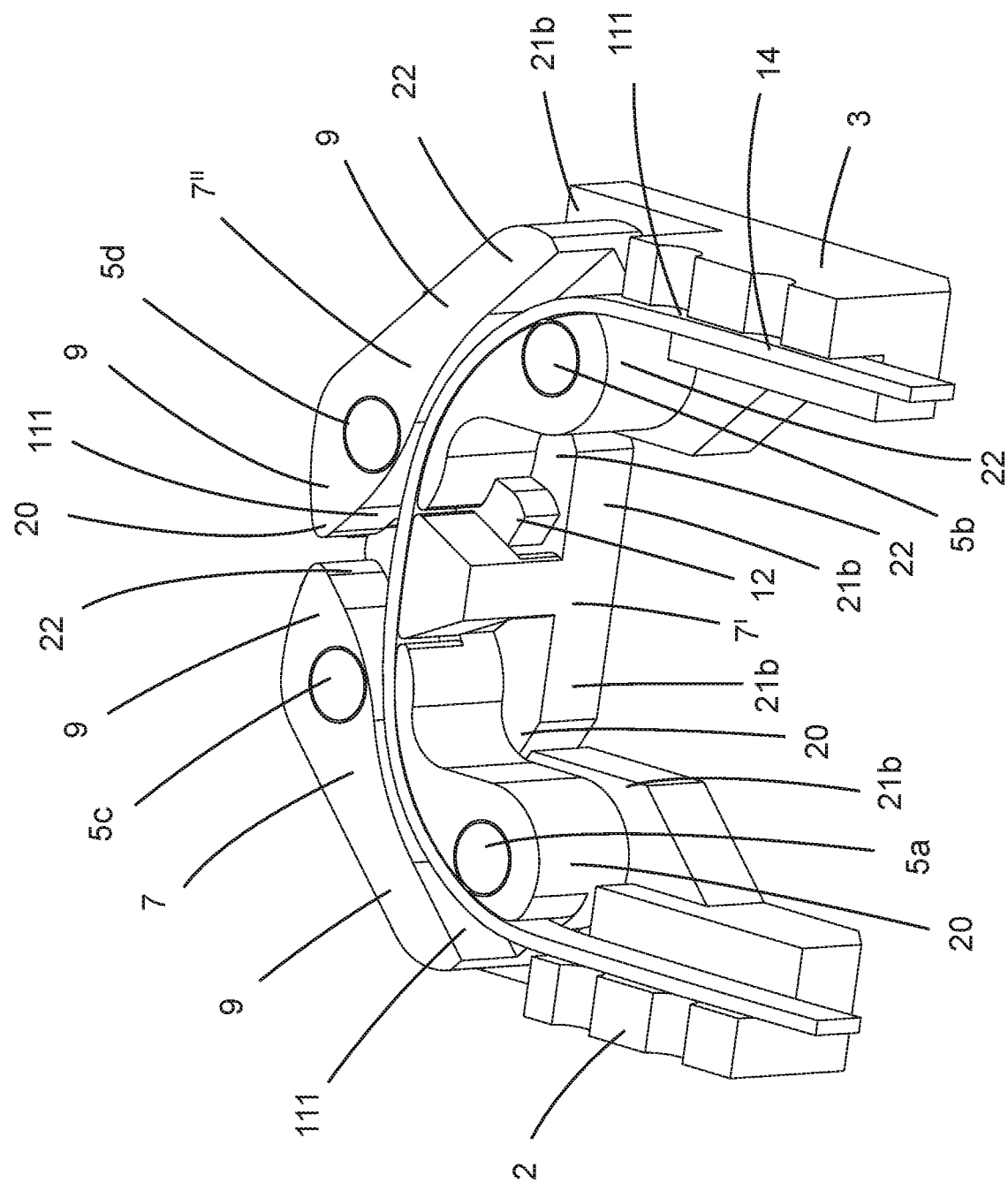
FIG. 6a shows an embodiment of a hinge of the present invention having three central parts in a bent position, in a perspective, cut away view.
Figure 6B:
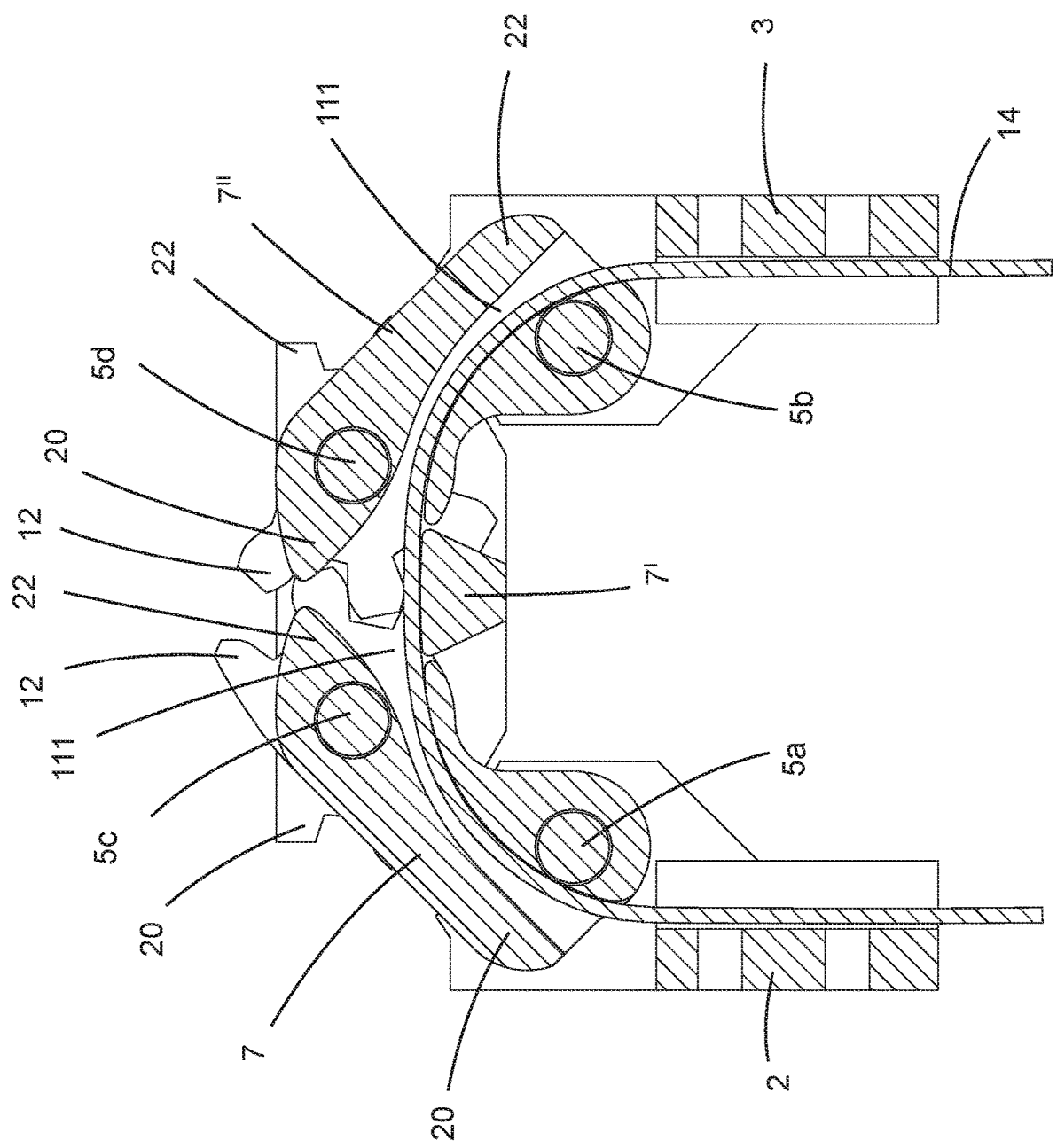
FIG. 6b shows the embodiment of FIG. 6a in a cross-sectional view orthogonally to the axis connections.
Figure 6D:
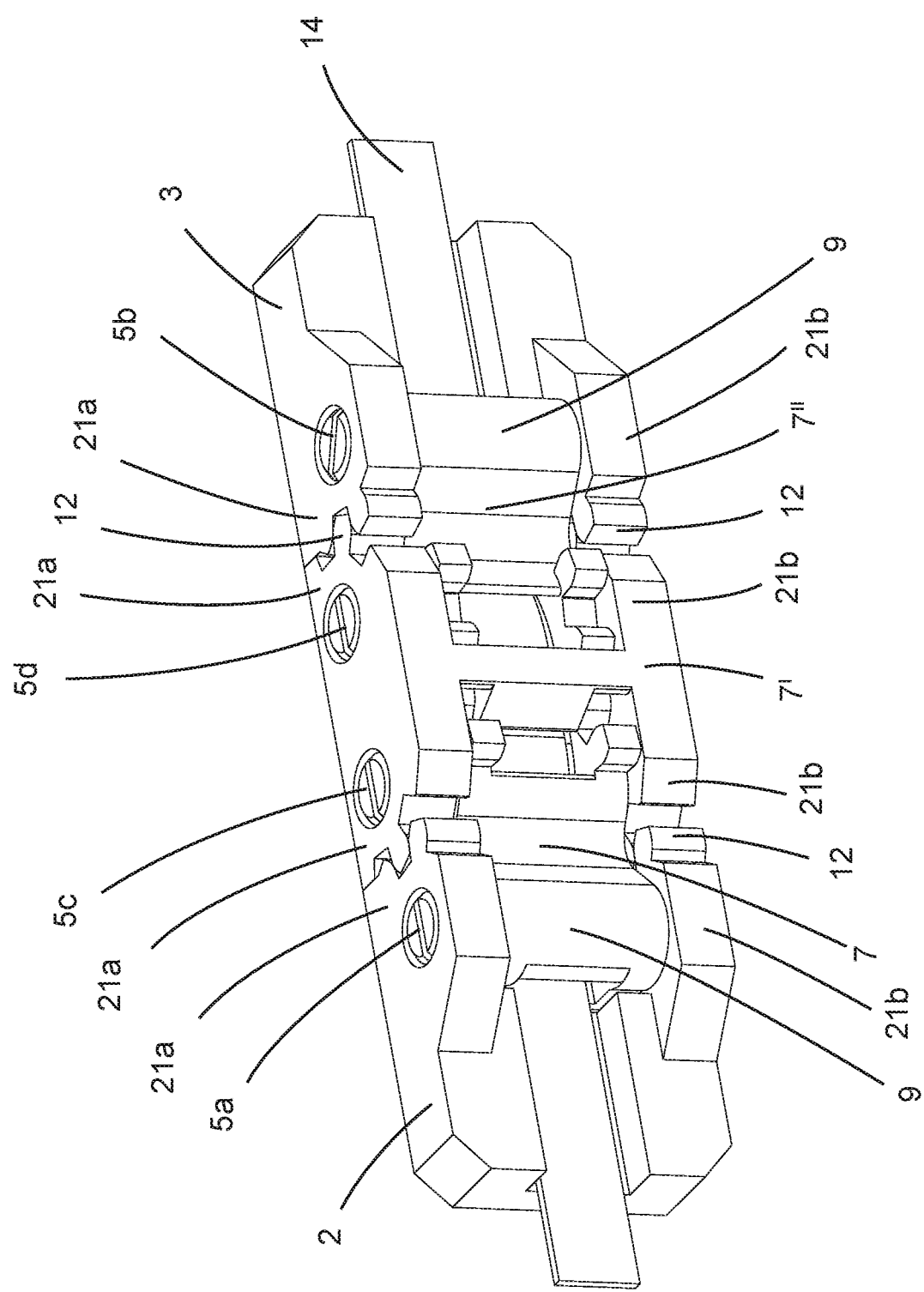
FIG. 6d shows the embodiment of FIG. 6c in a perspective view.

In FIG. 6a an embodiment having three central parts 7, 7', 7" is shown in a bent position, in a cut-away view. Through the hinge 4 a cable/wire/pcb 14 is running in a recess or throughgoing hole 111, as previously described. Four axis connections 5a, 5b, 5c, 5d are provided. At least one of the axis connections is situated on a first side of the recess or throughgoing hole 111 and at least one of the axis connections is situated on a second side of the recess or throughgoing hole 111. In the shown embodiment a first axis connection 5a is situated on an inner side of the throughgoing hole 111. A third axis connection 5c as well as a fourth axis connection 5d are provided on an outer side of the recess or throughgoing hole 111 and the second axis connection 5b is situated on the inner side of the recess or throughgoing hole 111.

The first part 2 may have fork portions 21 cooperating with a middle portion 9 at a first end 20 of the central part 7. At a second end 22 of the central part 7 a middle portion 9 is provided which cooperates with a fork portion 21 in a first end 20 of a next central part 7'. At a second end 22 of the next central part 7' a fork portion 21 is cooperating with a middle portion 9 of a further central part 7". At a second end 22 of the further central part 7" a middle portion 9 is cooperating with a for portion 21 of the second part.

In the shown embodiment of FIGS. 6a-6d also cogs 12 are provided for a controlled bending of the hinge 4. The first part 2 has fork portions 21 provided with cogs 12 in their ends. The middle portion 9 of central part 7 protrudes into the recess 10 between the fork portions 21 of the first part 2. In the second end 22 of the central part 7 the middle portion 9 is provided with cogs 12, and the middle portion 9 goes into a recess 10 between fork portions 21 of the next central part 7' also provided with cogs 12. The fork portions 21 in the first end 20 of the next central part 7' are provided with cogs 12 which mesh with the cogs 12 of the first part 2. The further central part 7" has a middle portion 9 which goes into the recess 10 between the fork portion 21 in the second end 22 of the next central part 7'. The first end 20 of the middle part 9 of the further part 3 is provided with cogs 12 which mesh with the cogs 12 on the second end 22 on the central part 7. In the second end 22 of the next central part 7' there are cogs 12 meshing with the fork portions 21 of the second part 3.

Obviously, it could be vice versa. But every second part will mesh with each other. Having meshing cogs 12 will control the bending so that the same amount of bending occurs around each axis connection 5a, 5b, 5c, 5d. Each central part may be of the same embodiment or mixed embodiments as described above referring to FIGS. 2b-2d. In the shown embodiment the next central part 7' differs from previous shown central parts since the axis connections 5c and 5d are situated on the same side of the recess or throughgoing hole 11 of the next central part ". Therefore, most of the controlling of the bending of the cable/wire/pcb 14 is provided by the walls 26, 27 of the central part 7 and the further central part 7". This will not step away from the general inventive idea, which scope is decided by the enclosed claims.

Figure 2E:
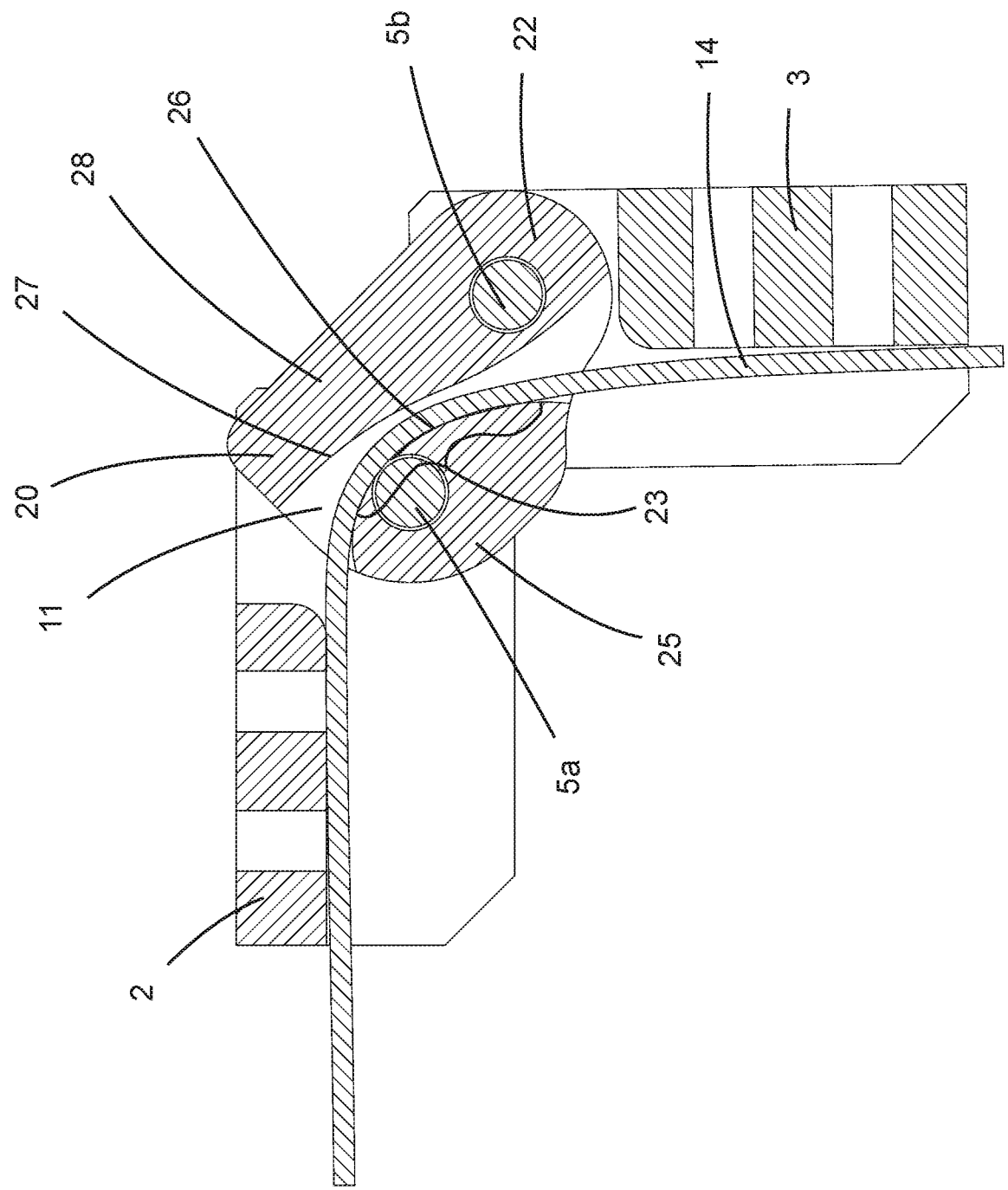
FIG. 2e shows the embodiment of FIG. 2d in a bent position, orthogonally to the axis connections in a cross-sectional view.

Preferably, the central part 7 and the further central part 7" is of the kind shown in FIGS. 2d and 2e as they will cause the cable/wire/pcb 14 into a pre-bent position in the use position, as can be seen in FIG. 6c. The central part 7 and further central part 7" are mirrored in the hinge 4. By means of the pre-bent position in the use position the cable/wire/pcb 14 will be less bent in the bent position then the hinge 4 as it starts with a bending to a straight position and then bends further into a bend in the same direction as the hinge 4, on each side.

Figure 7:
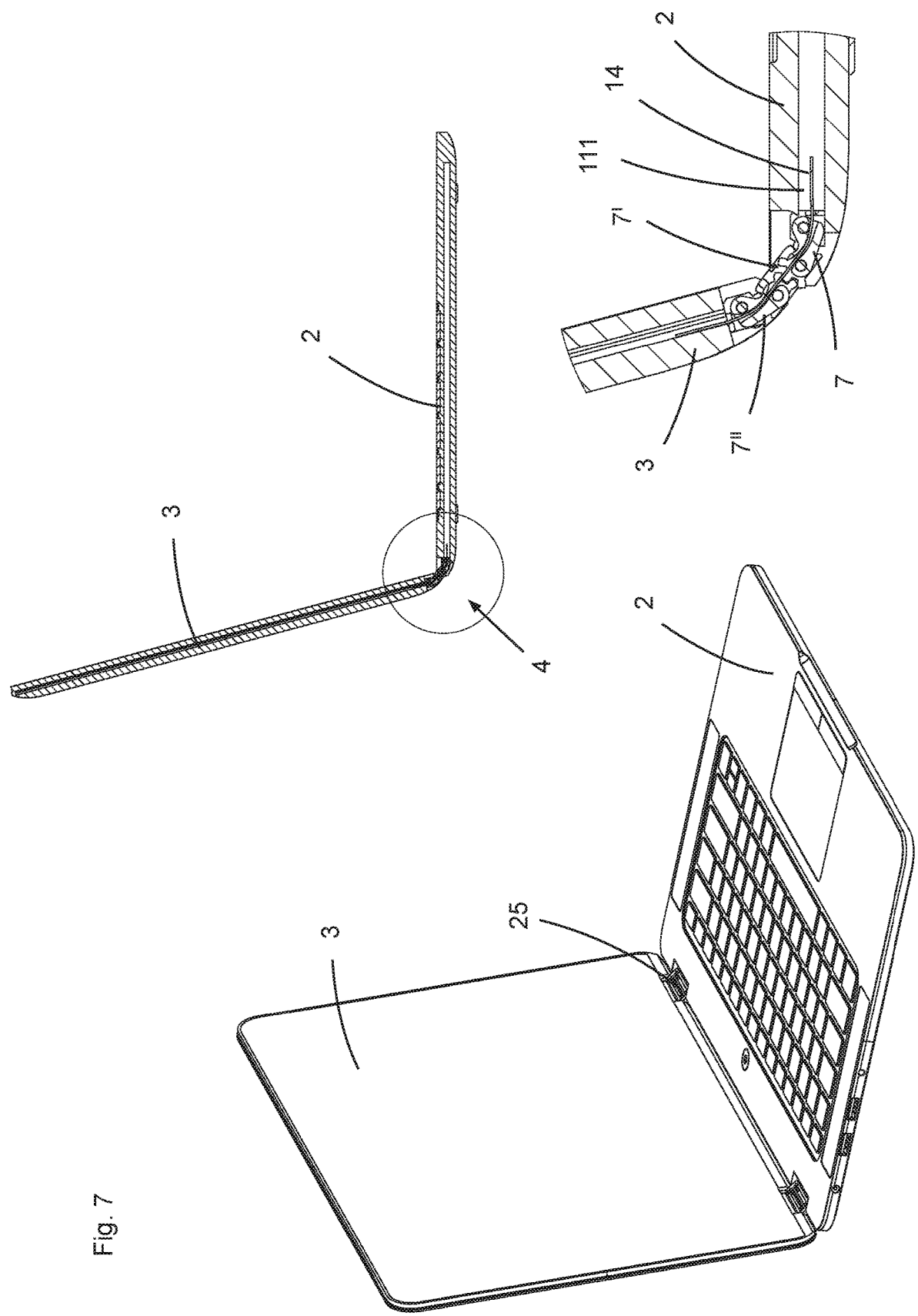
FIG. 7 shows an embodiment of a laptop of the present invention, in a cut-away and detail view.

FIG. 7 shows an embodiment of the inventive hinge according to FIGS. 6a-d provided in a laptop or the like, where the first part 2 is the keyboard part and the second part 3 is the screen part. The inner side 25 of the hinge 4 faces the keys of the keyboard 2 and the screen 3, which two parts 2, 3 are movable towards and from each other around the hinge. In the bent position the laptop is closed. The use position is when the laptop is open, when the screen part 3 is in an angle to the keyboard 2, and this could be in a range of angles to the keyboard part, but at least 80 degrees angle in between the first and second part 2, 3. In FIG. 7 one of the hinges are shown in a cut away view and also a detailed view is shown. The laptop may obviously have one wide hinge along the width of the laptop or two or more smaller hinges. However, the cross-sectional design is according to the inventive idea. The hinge axes may be provided as divided axles for each axis connection and hinge 4 going through a portion of the hinge 4, or through the full hinge 4, or as one long axle going through a single wide hinge or several hinges, for example all hinges 4. Although the lap top embodiment is shown with a hinge 4 having three central parts it is also conceivable to have only one or two central parts, as described above, or more than three, which will be described below.

Figure 8B:
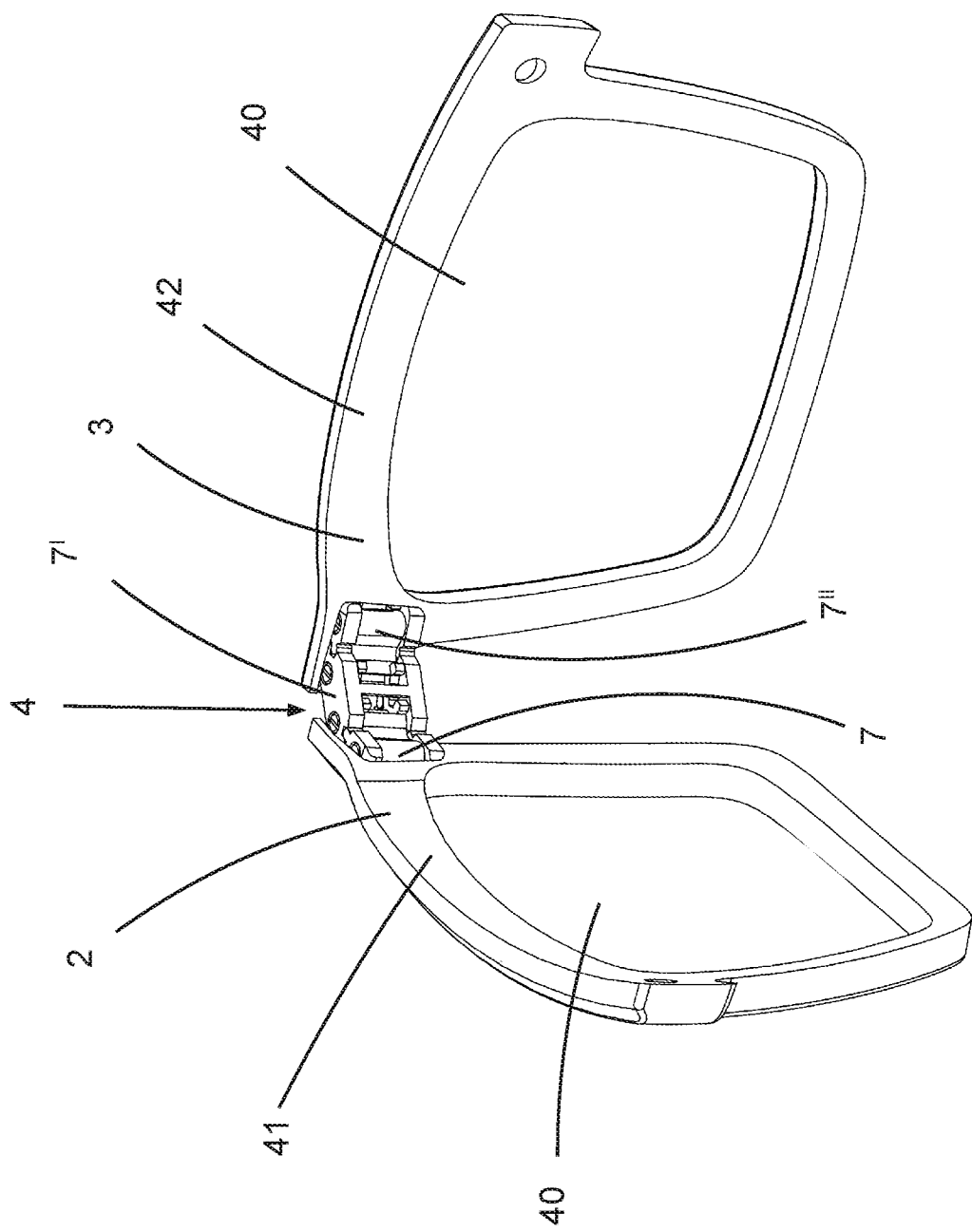
FIG. 8b shows a foldable clip-on from the inside in a slightly bended position, in a perspective view.

Another application of the hinge according to FIGS. 6a-d is shown in FIG. 8b, where a foldable clip-on for spectacles is shown in a position between the use position and the bent position, from the inside. The first part 2 is one of the lens frames and the second part 3 is the other of the lens frames. Although the clip-on embodiment is shown with a hinge 4 having three central parts it is also conceivable to have only two central parts in accordance with the embodiment described in FIGS. 5*a* and *b*.

Figure 9B:
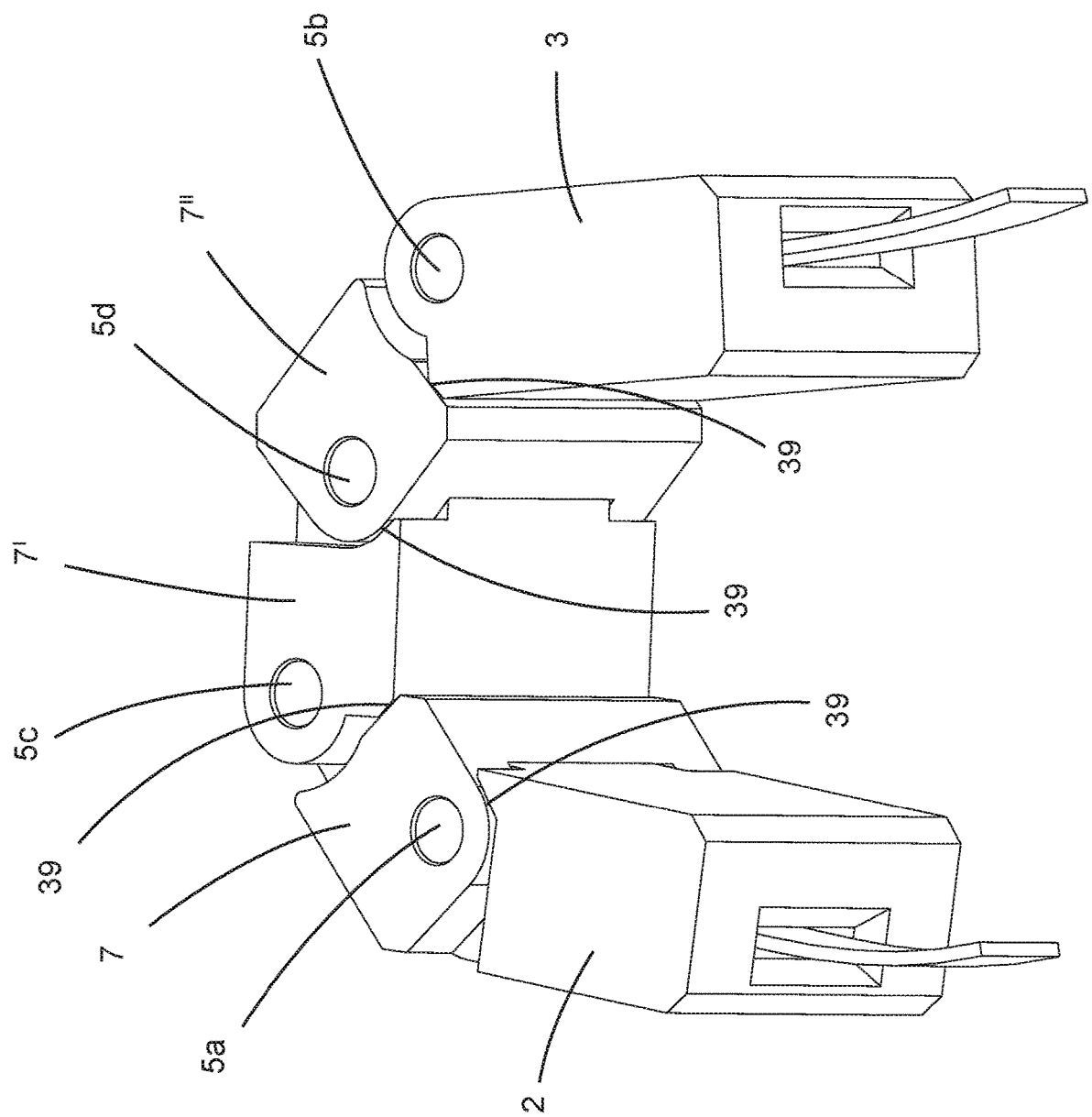
FIG. 9b shows the embodiment of FIG. 9a in a perspective view.

In FIGS. 9*a* and 9*b* an embodiment having three central parts is shown. A first part 2 connects at a first axis connection 5*a* with a central part 7. The first part 2 may have fork portions 21 cooperating with a middle portion 9 at a first end 20 of the central part 7. The fork portions 21 and the middle portion 9 may be provided vice versa instead. In the shown embodiment the next central part 7' also has a middle portion 9 in its first end 20 cooperating with fork portions 21 in the second end 22 of the central part 7 for cooperation around an axis connection 5*c* with a middle portion 9 of a further central part 7". In the shown embodiment all the central parts are provided with a middle portion 9 in their first end 20 and fork portions 21 in their second end 22. The second part 3 is provided with a middle portion 9 which will cooperate around a second axis connection 5*b* with a fork portion 21 of the further central part 7".

All the central parts 7-7" has a recess or throughgoing hole 11 reaching between the first end 20 and the second end 22 forming a recess or throughgoing hole 111 for the hinge 4 through which the cable/wire/pcb 14 runs. The axis connections are provided in each end but on opposite sides of the recess or throughgoing hole 11 in this embodiment. Thus, as can be seen in FIG. 9*a*, the axis connections are provided crosswise of the recess or throughgoing hole 111 of the hinge 4.

In one embodiment the central parts may be designed in such a way that they will physically stop a bending movement beyond a certain angle in either or both directions outwards and inwards, respectively. This could for example be accomplished with a protrusion 39 on a central part 7 having a gap up to the next central part 7' providing a possible bending until the protrusion 39 hits the next central part 7'. These protrusions 39 and gaps can be provided on both sides of the hinge 4 for delimited bending possibilities in both directions if desired. The fork portions 21 and the middle portion 9 may be provided vice versa instead.

It is also conceivable to instead have central parts with middle portions 9 in both ends 20, 22 and central parts with fork portions 21 in both ends, which latter are arranged every second with the previous ones, i.e., alternating (not shown), following the teaching described under referral to FIGS. 6*a-d*. If desired, it is also possible to add cogs in such an embodiment (not shown).

Obviously, it is possible to connect further central parts up to a last central part 7"'. All the central parts 7-7"' has a recess or throughgoing hole 11 reaching between the first end 20 and the second end 22 forming a recess or throughgoing hole 111 for the hinge 4 through which the cable/wire/pcb 14 runs. The axis connections are provided in each end but on opposite sides of the recess or throughgoing hole 11 in this embodiment. Thus, as can be seen in FIG. 9*a*, the axis connections are provided crosswise of the recess or throughgoing hole 111 of the hinge 4.

In one embodiment (not shown) cogs 12 are used to control the bending outwards and inwards, respectively. As described above every second part will mesh with each other. In this embodiment the first part 2 and the next central part 7' mesh with each other; the central part 7 and a further central part 7" mesh with each other; the next central part 7' and a still further central part 7''' mesh with each other up to the second part 3 which will mesh with the next to last central part $7^{n-1}$. Having meshing cogs 12 will control the bending so that the same amount of bending occurs around each axis connection 5*a*, 5*b*, 5*c* and so on.

Figure 10A:
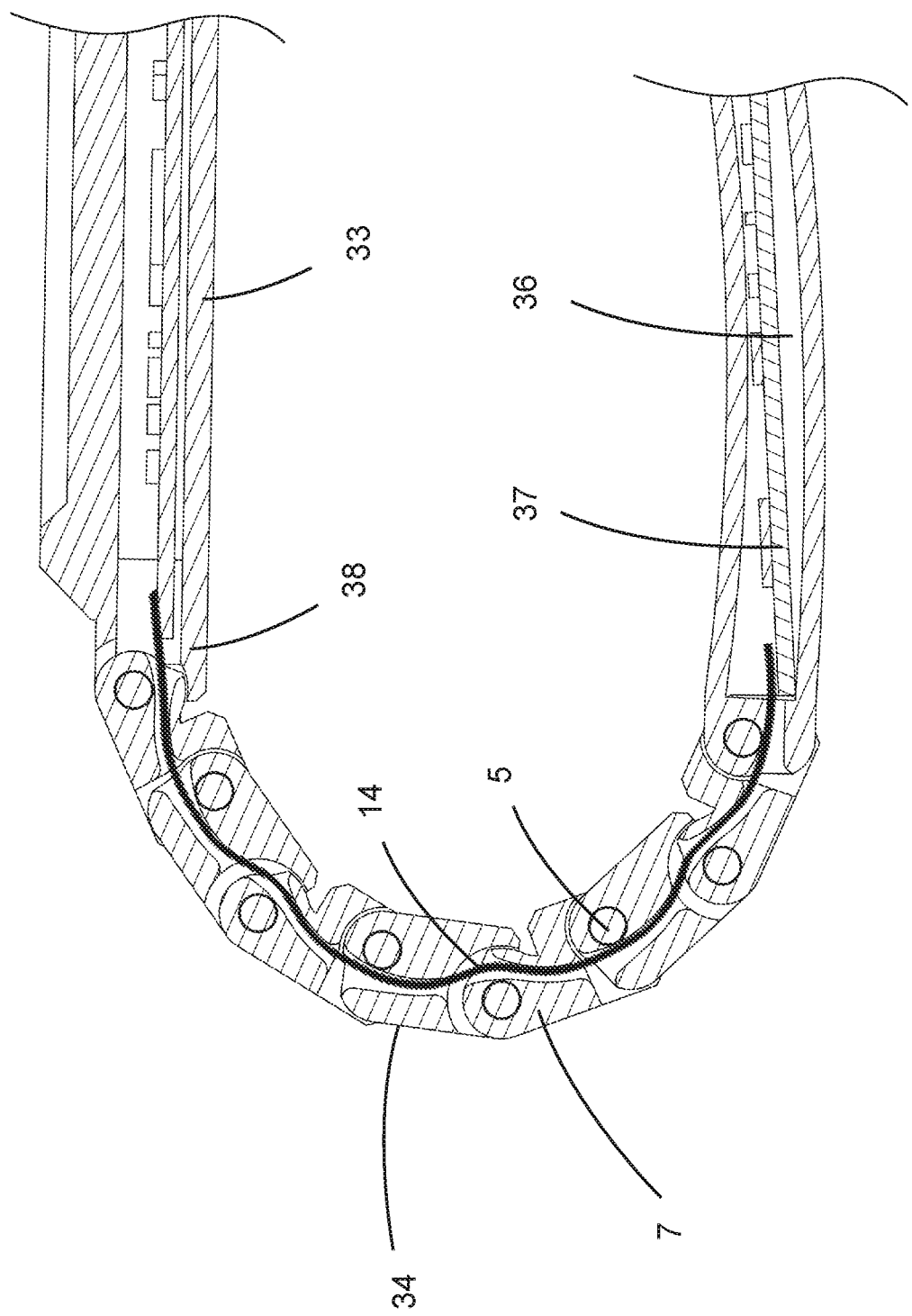
FIG. 10a shows an embodiment of a smartwatch in a cross-sectional view, orthogonally to the axis connections.
Figure 10B:
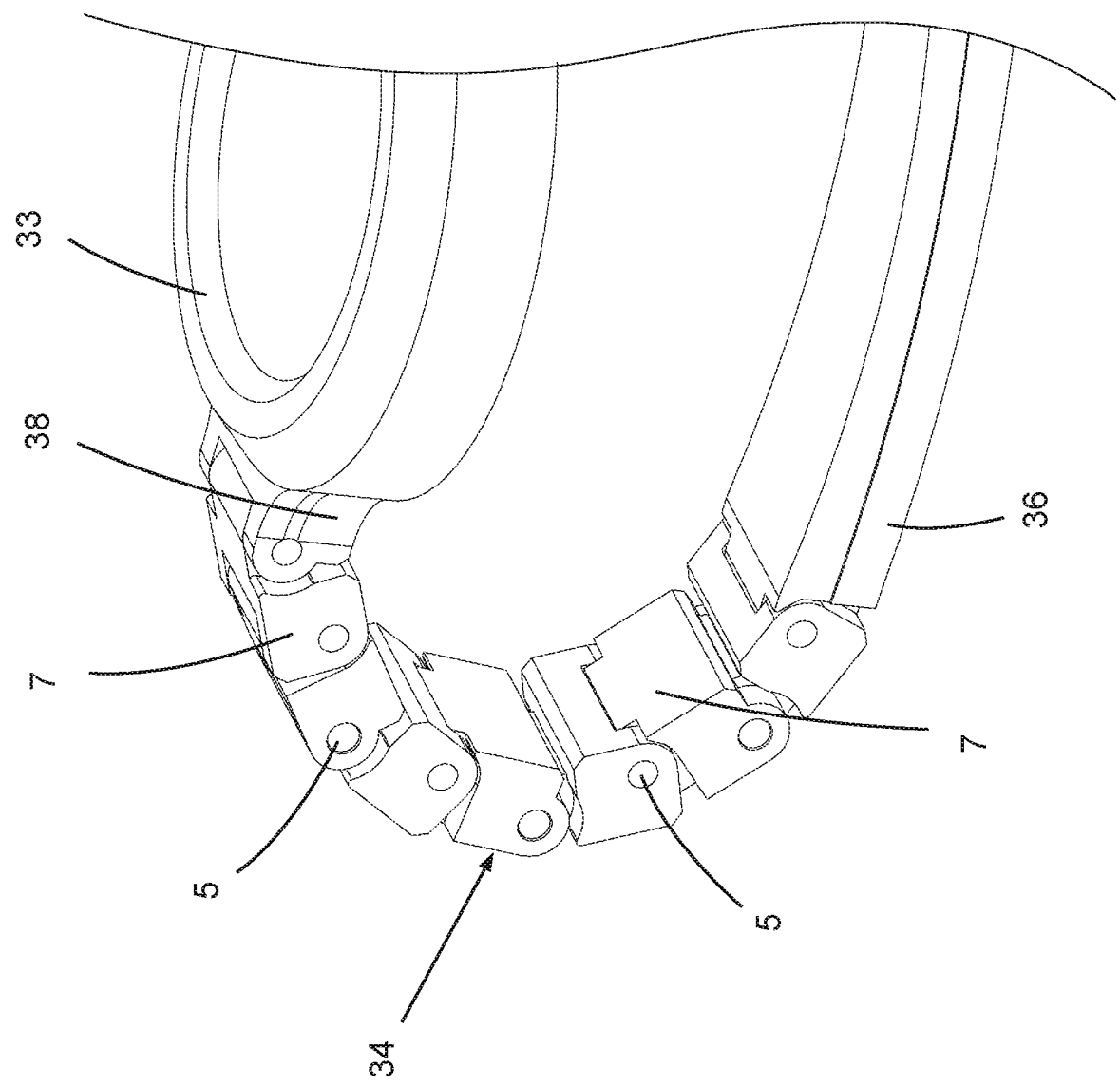
FIG. 10b shows an embodiment of a smartwatch in a perspective view.

In FIG. 10 an embodiment for a smartwatch is shown. A cable/wire/pcb 14 goes between a watch case 33 through a strap 34 to a clasp 36. The clasp 36 may be provided with different kind of sensors 37, such as pulse and EKG sensors. For example, a first part 2 is the lugs 38 of the watch case 33, which connects with central parts 7, as described above under referral to FIG. 9*a*. The lugs may have fork portions 21 cooperating with a middle portion 9 at a first end 20 of the central part 7 or a middle portion 9 cooperating with fork portions in the first end 20 of the central part 7. The last central part 7" connects to the second part 3, which in this embodiment is the clasp 36. The axis connections are provided crosswise the recess or throughgoing hole 111 and thus the cable/wire/pcb 14 along the strap 34. It is conceivable to form this kind of hinge having several central parts with any type of central parts described above or a mixture of them. It is conceivable to provide them with cogs 12 or protrusions 39.

Many different embodiments have been described and they can freely be combined or mixed in any kind of way as is suitable for a desired application. For example, different embodiments of central parts, number of central parts, having additional cogs or not, having middle portions or fork portions in one, both or none ends, having protrusions and gaps or not and so on. These different embodiments could be applied in for example foldable smart spectacles, such as AR/VR/MR or smart headsets or eyewear or foldable clip-ons; smart phones, laptops, tablets or screen to screen/screen to keyboard devices; smart bracelets or smart watches; antennas to device foldable connections; foldable over the head headphones; screen to device, such as foldable screen to cameras; robotic arms, prosthetic devices; swingarms for electrical motorcycles or mopeds.

A hinge (4) between a first part (2) and a second part (3) of an electrical device, rendering it possible for the device to be in a use position and a bent position, respectively, wherein at least one cable/wire/pcb (14) is running between the first part and the second part, the hinge (4) has at least two axes connections, a first axis connection (5*a*) positioned at the first part (2) and a second axis connection (5*b*) positioned at the second part (3), and therebetween one central part (7), wherein the central part (7) is connected to the first axis connection (5*a*) in a first end (20) and the second axis connection (5*b*) in a second end (22), wherein the central part (7) is provided with a recess or throughgoing hole (11) going between the first end (20) to its second end (22) for the at least one cable/wire/pcb (14) to run freely in, forming a recess or throughgoing hole (111) through the whole hinge (4), wherein one of said axis connections is situated on a first side of the recess or throughgoing hole (111) and the other of said axis connections is situated on a second side of the recess or throughgoing hole (111).

A hinge (4) between a first part (2) and a second part (3) of an electrical device, rendering it possible for the device to be in a use position and a bent position, respectively, wherein at least one cable/wire/pcb (14) is running between the first part and the second part, the hinge (4) has at least two axes connections, a first axis connection (5*a*) positioned at the first part (2) and a second axis connection (5*b*) positioned at the second part (3), and therebetween two central parts (7, 7'), wherein the at least one central part (7) is connected to the first axis connection (5*a*) in a first end (20) and the second end (22) of the central part (7) is connected to a next central part (7') in a first end (20) thereof, which next central part (7') in turn is connected to the second axis connection (5b) in a second end (22) thereof, wherein the each central part (7, 7') is provided with a recess or throughgoing hole (11) going between the first end (20) to its second end (22) for the at least one cable/wire/pcb (14) to run freely in, forming a recess or throughgoing hole (111) through the whole hinge (4), wherein at least one of said axis connections is situated on a first side of the recess or throughgoing hole (111) and at least one of said axis connections is situated on a second side of the recess or throughgoing hole (111).

A hinge (4) between a first part (2) and a second part (3) of an electrical device, rendering it possible for the device to be in a use position and a bent position, respectively, wherein at least one cable/wire/pcb (14) is running between the first part and the second part, the hinge (4) has at least two axes connections, a first axis connection (5a) positioned at the first part (2) and a second axis connection (5b) positioned at the second part (3), and therebetween three central parts (7, 7', 7"), wherein the first central part (7) is connected to the first axis connection (5a) in a first end (20) and the second end (22) of the central part (7) is connected to a next central part (7') in a first end (20) thereof, which next central part (7') in turn is connected to a next central part (7") in a first end (20) thereof and the second end (22) of the next central part (7") is connected to the second axis connection (5b) at the second part (3), wherein the each central part (7, 7', 7") is provided with a recess or throughgoing hole (11) going between the first end (20) to its second end (22) for the at least one cable/wire/pcb (14) to run freely in, forming a recess or throughgoing hole (111) through the whole hinge (4), wherein at least one of said axis connections is situated on a first side of the recess or throughgoing hole (111) and at least one of said axis connections is situated on a second side of the recess or throughgoing hole (111).

The invention claimed is:

1. A hinge (4) between a first part (2) and a second part (3) of an electrical device, rendering it possible for the device to be in a use position and a bent position, respectively, wherein at least one cable/wire/pcb (14) is running between the first part (2) and the second part (3), the hinge (4) comprising:
   at least two axes connections (5a, 5b), wherein a first axis connection (5a) is positioned at the first part (2) and a second axis connection (5b) is positioned at the second part (3), and therebetween at least one central part (7),
   wherein the at least one central part (7) is connected to the first axis connection (5a) in a first end (20) and the second axis connection (5b) in a second end (22), or
   the second end (22) of the central part (7) is connected to a third axis connection (5c) at a first end (20) of a second central part (7'), which second central part (7') in turn is connected to
   the second axis connection (5b) at a second end (22) of the second central part (7'), or to a fourth axis connection (5d) at a third central part (7") and so on until the second axis connection (5b) is reached at the second part (3),
   wherein the at least one central part (7, 7', 7") is provided with a recess or throughgoing hole (11) extending from the first end (20) to the second end (22) for the at least one cable/wire/pcb (14) to run in, forming a continuous recess or throughgoing hole (111) through the whole hinge (4),
   wherein at least one of said axis connections is situated on a first side of the continuous recess or throughgoing hole (111) and at least one of said axis connections is situated on a second side of the continuous recess or throughgoing hole (111) in both the use position and the bent position, respectively, and
   wherein the geometry and arrangement of the central part and axis connections are designed to minimize the bending radius of the at least one cable/wire/pcb, ensuring the at least one cable/wire/pcb follows a neutral bending plane and avoiding excessive bending, stretching, or crinkling of the cable/wire/pcb during the transition between the use position and the bent position;
   wherein the first part (2) has a middle portion (9) protruding between two fork portions (21) at the first end (20) of the central part (7),
   wherein:
      the central part (7) has a middle portion (9) at the second end (22) of the central part (7), which middle portion (9) protrudes between two fork portions (21) of the second part (3), or a next central part (7', 7");
      or the first part (2) has two fork portions (21) receiving a middle portion (9) at the first end of the central part (7), and
      the central part (7) has two fork portions (21) at the second end of the central part, which two fork portions receive the middle portion (9) of the second part (3), or a next central part (7', 7");
      or every second central part has a middle portion (9) at both ends (20, 22) and every other central part has fork portions (21) at both ends (20, 22); and
   wherein each axis connection is provided with a screw which goes through a first fork portion (21a) and the middle portion (9) freely and grip into a second fork portion (21b) with engaging threads (31).

2. A hinge according to claim 1, wherein the at least one cable/wire/pcb (14) due to the axis connections (5a, 5b) is bent in radii having center points on opposite sides of the at least one cable/wire/pcb (14) in the use position in the at least one central part.

3. A hinge according to claim 1, wherein the at least one cable/wire/pcb (14) is less bent or deflected in each point in the hinge (4) than the second part (3) will be deflected from the first part (2) in the use position to the bent position.

4. A hinge according to claim 1, wherein the recess or throughgoing hole (11) of a central part (7) has a main curvature (23) having a radius with a center point on an inner side (25) of the hinge (4) as a decreased angle occurs between the first part (2) and the second part (3) in the bent position.

5. A hinge according to claim 4, wherein a wall (26) of the inner side (25) of the central part (7) towards the recess or throughgoing hole (11) has a radius corresponding to a neutral bending plane (13) of the hinge (4) for the at least one cable/wire/pcb (14) to rest against in the bent position.

6. A hinge according to claim 4, wherein the recess or throughgoing hole (11) is wider in its first (20) and second end (22) of the at least one central part (7) to allow the at least one cable/wire/pcb (14) to rest against a wall (27) towards an outer side (28) of the hinge (4) in the use position, allowing for two opposite bends of the at least one cable/wire/pcb (14).

7. A hinge according to claim 1, wherein the first part (2) and the second part (3) has corresponding cogs (12), which in case of one central part (7) are meshing with each other at the hinge (4) for a controlled movement between the use and the bent position, in case of more than one central part (7, 7', 7") the first part (2) has cogs (12) meshing with cogs

(12) provided at the first end of the second central part (7'), the central part (7) has cogs in the second end meshing with cogs at the second part (3), or a third central part (7") and so on up to the second part (3), wherein the parts are meshing pairwise with every second part.

8. Smart spectacles or a foldable clip-on having a cable/wire/pcb or a laptop or a smart phone or a smart bracelet or a smart watch or an antenna to device foldable connection or headphones or a camera with foldable screen or a robotic arm or a prosthetic device or a swingarm for electrical motorcycles or electrical mopeds comprising at least one hinge (4) according to claim 1.

* * * * *